United States Patent
Henley

(10) Patent No.: US 7,910,458 B2
(45) Date of Patent: Mar. 22, 2011

(54) METHOD AND STRUCTURE USING SELECTED IMPLANT ANGLES USING A LINEAR ACCELERATOR PROCESS FOR MANUFACTURE OF FREE STANDING FILMS OF MATERIALS

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 315 days.

(21) Appl. No.: 12/019,886

(22) Filed: Jan. 25, 2008

(65) Prior Publication Data
US 2009/0042369 A1    Feb. 12, 2009

Related U.S. Application Data

(66) Substitute for application No. 60/887,086, filed on Jan. 29, 2007.

(51) Int. Cl.
*H01L 21/263* (2006.01)
(52) U.S. Cl. .................. 438/463; 257/E21.331
(58) Field of Classification Search ............ 438/463, 438/460, 473, E21.331, E21.214
See application file for complete search history.

(56) References Cited

U.S. PATENT DOCUMENTS

| | | | |
|---|---|---|---|
| 6,033,974 A | 3/2000 | Henley et al. | |
| 6,184,111 B1 | 2/2001 | Henley et al. | |
| 6,500,732 B1 | 12/2002 | Henley et al. | |
| 6,544,862 B1 | 4/2003 | Bryan | |
| 6,548,382 B1 | 4/2003 | Henley et al. | |
| 7,148,124 B1 * | 12/2006 | Usenko | 438/458 |
| 7,312,125 B1 | 12/2007 | Xiang et al. | |
| 2003/0124815 A1 | 7/2003 | Henley et al. | |
| 2006/0166472 A1 | 7/2006 | Henley et al. | |
| 2008/0206962 A1 * | 8/2008 | Henley et al. | 438/460 |

FOREIGN PATENT DOCUMENTS

WO    WO 01/11930 A    2/2001

OTHER PUBLICATIONS

Australian Patent Office Search Report for Singapore Application No. SG200800768-4, mailed on May 5, 2009, 4 pages total.
Australian Patent Office Search Report for SG Application No. 200800768-4, mailed on Jun. 3, 2008, 6 pages total.

* cited by examiner

*Primary Examiner* — Thao P. Le
(74) *Attorney, Agent, or Firm* — Kilpatrick Townsend and Stockton LLP

(57) ABSTRACT

A method for fabricating free standing thickness of materials using one or more semiconductor substrates, e.g., single crystal silicon, polysilicon, silicon germanium, germanium, group III/IV materials, and others. In a specific embodiment, the present method includes providing a semiconductor substrate having a surface region and a thickness. The method includes subjecting the surface region of the semiconductor substrate to a first plurality of high energy particles provided at a first implant angle generated using a linear accelerator to form a region of a plurality of gettering sites within a cleave region, the cleave region being provided beneath the surface region to defined a thickness of material to be detached, the semiconductor substrate being maintained at a first temperature. In a specific embodiment, the method includes subjecting the surface region of the semiconductor substrate to a second plurality of high energy particles at a second implant angle generated using the linear accelerator, the second plurality of high energy particles being provided to increase a stress level of the cleave region from a first stress level to a second stress level. In a preferred embodiment, the semiconductor substrate is maintained at a second temperature, which is higher than the first temperature. The method frees the thickness of detachable material using a cleaving process, e.g., controlled cleaving process.

41 Claims, 20 Drawing Sheets

METHOD AND STRUCTURE USING SELECTED IMPLANT ANGLES USING A LINEAR ACCELERATOR PROCESS FOR MANUFACTURE OF FREE STANDING FILMS OF MATERIALS

CROSS-REFERENCE TO RELATED APPLICATION

The instant nonprovisional patent application claims priority to U.S. Provisional Patent Application No. 60/887,086, filed Jan. 29, 2007 and incorporated by reference herein for all purposes.

BACKGROUND OF THE INVENTION

The present invention relates generally to technique including a method and a structure for forming substrates using a layer transfer technique. More particularly, the present method and system provides a method and system using a linear accelerator process for the manufacture of thick free standing semiconductor films for a variety of applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human being have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon (i.e. polycrystalline silicon) and/or single crystal silicon materials. These materials are often difficult to manufacture. Polysilicon cells are often formed by manufacturing polysilicon plates. Although these plates may be formed effectively, they do not possess optimum properties for highly effective solar cells. Single crystal silicon has suitable properties for high grade solar cells. Such single crystal silicon is, however, expensive and is also difficult to use for solar applications in an efficient and cost effective manner. Additionally, both polysilicon and single-crystal silicon materials suffer from material losses during conventional manufacturing called "kerf loss", where the sawing process eliminates as much as 40% and even up to 60% of the starting material from a cast or grown boule and singulate the material into a wafer form factor. This is a highly inefficient method of preparing thin polysilicon or single-crystal silicon plates for solar cell use.

Generally, thin-film solar cells are less expensive by using less silicon material but their amorphous or polycrystalline structure are less efficient than the more expensive bulk silicon cells made from single-crystal silicon substrates. These and other limitations can be found throughout the present specification and more particularly below.

From the above, it is seen that techniques for forming suitable substrate materials of high quality and low cost are highly desired.

BRIEF SUMMARY OF THE INVENTION

According to the present invention, techniques including a method and a structure for forming substrates using a layer transfer technique are provided. More particularly, the present method and system provides a method and system using a linear accelerator process for the manufacture of thick free standing semiconductor films for a variety of applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nano-technology structures, sensors, actuators, integrated circuits, biological and biomedical devices, and the like.

In a specific embodiment, the present invention provides a method for fabricating free standing thickness of materials using one or more semiconductor substrates, e.g., single crystal silicon, polycrystalline silicon, polysilicon, silicon germanium, germanium, silicon carbide, gallium nitride, group IIIV materials, and others. In a specific embodiment, the present method includes providing a semiconductor substrate having a surface region and a thickness. The method includes subjecting the surface region of the semiconductor substrate to a first plurality of high energy particles generated using a linear accelerator to form a region of a plurality of gettering sites within a cleave region, the cleave region being provided beneath the surface region to define a thickness of material to be detached, the semiconductor substrate being maintained at a first temperature. The first plurality of high energy particles are provided at a first implant angle. In a specific embodiment, the method includes subjecting the surface region of the semiconductor substrate to a second plurality of high energy particles generated using the linear accelerator, the second plurality of high energy particles being provided to increase a stress level of the cleave region from a first stress level to a second stress level. The second plurality of high energy particles are provided at a second implant angle. In a preferred embodiment, the semiconductor substrate is maintained at a second temperature, which is higher than the first temperature. The method frees the thickness of detachable material using a cleaving process, e.g., controlled cleaving process. The term "first" and "second" as used is not intended to be limiting and should be construed by their ordinary meaning and may be different or the same according to specific embodiments.

In an alternative specific embodiment, the present invention provides a method for forming a free standing thickness of layer transferred material, e.g., single crystal silicon, polysilicon, polycrystalline silicon, silicon germanium, silicon carbide, gallium nitride, germanium, group III/IV materials, and others. The single-crystal silicon can be either from solar, semiconductor or metallic grade purity levels, depending upon tradeoffs sought between factors such as efficiency, cost, and post-processing such as impurity gettering. Any of the single-crystal material can be cut to specific orientations that offer advantages such as ease of cleaving, preferred device operation, or the like. For example, silicon solar cells can be cut to have predominantly (100), (110), or (111) surface orientation to yield free-standing substrates of this type. Of course, starting material having orientation faces which are intentionally mis-cut from the major crystal orientation can be also prepared. Of course there can be other variations, modifications, and alternatives. The method includes providing a crystalline substrate material having a surface region. The method includes introducing a plurality of first particles at a first dose range and within a first temperature range through the surface region to an accumulation region of the crystalline substrate material to form an implant profile having a peak concentration and a base spatially disposed within a dimension to form the accumulation region. The plurality of first particles are provided at a first implant angle. In a specific embodiment, the first dose range is less than an amount sufficient to cause the plurality of particles to be permanently disposed in the crystalline substrate material at the accumulation region to form a cleave region. In a specific embodiment, the first particles cause a plurality of defects in the crystalline material in the cleave region, which is preferably defined by a depth greater than about 10 microns beneath the surface region and a slice of crystalline material to be detached between the cleave region and the surface region.

In an optional specific embodiment, the method includes performing a treatment process on the crystalline substrate material to cause formation of a plurality of substantially permanent defects that have been quenched in the crystalline substrate material from the first particles in the accumulation region. The method also includes introducing a plurality of second particles at a second dose range and a second temperature range into the accumulation region to increase an internal stress in the accumulation region to cause a portion of the accumulation region to be cleavable. The plurality of second particles are provided at a second implant angle. In a specific embodiment, the method includes forming a free standing thickness of crystalline material by detaching the thickness of crystalline material from a remaining portion of the crystalline substrate material.

Still further, the present invention provides a method for fabricating free standing thickness of materials using one or more semiconductor substrates. In a preferred embodiment, the method uses one or more patterned regions to facilitate initiation of a cleaving action. In a specific embodiment, the present method provides a semiconductor substrate having a surface region and a thickness. The method includes subjecting the surface region of the semiconductor substrate to a first plurality of high energy particles generated using a linear accelerator to form a patterned region of a plurality of gettering sites within a cleave region. In a preferred embodiment, the cleave region is provided beneath the surface region to defined a thickness of material to be detached. The semiconductor substrate is maintained at a first temperature. In a specific embodiment, the first plurality of high energy particles are provided at a first implant angle. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. In a specific embodiment, the semiconductor substrate is maintained at a second temperature and the second plurality of particles are provided at a second implant angle. The method includes initiating the cleaving action at a selected region of the patterned region to detach a portion of the thickness of detachable material using a cleaving process and freeing the thickness of detachable material using a cleaving process.

In yet an alternative specific embodiment, the present invention provides a method for forming a film of material from a bulk semiconductor substrate, e.g., single crystal silicon, polysilicon. In a specific embodiment, the substrate can also have various shapes such as square, square-like, round, annular, rectangular, and others. Depending upon the embodiment, the substrate can also be metal, insulator, or a combination of these materials. The method includes providing a semiconductor substrate having a surface region and a thickness, which is an entirety of the semiconductor substrate thickness. The method includes subjecting the surface region of the semiconductor substrate to a plurality of particles to form a cleave region (e.g., plurality of particles embedded from a single or multiple implants and/or diffusion), which is defined underlying the surface region to form a stressed region and to define a thickness of material to be detached. Depending upon the embodiment, the thickness of material has a thickness of about 20 microns and greater, or may be slightly thinner, as long as it is free standing, e.g., self supporting, free from a stiffener or the like. In a specific embodiment, the method includes freeing the thickness of detachable material using a cleaving process while maintaining a portion of the stress region attached to the thickness of material to cause the thickness of material to be characterized by a deformed shape, e.g., curled at edges or end regions. In a specific embodiment, the method includes removing the portion of the stress region attached to the thickness of material to cause the deformed shape to be removed and yield a substantially planar shape, which is generally flat or the like.

In a preferred embodiment, the method includes one or more techniques to remove the portion of the stressed region that causes deformation of the thickness of material. In a specific embodiment, the removing includes etching the portion of the stressed region, which causes the thickness of material to have the deformed shape. That is, etching can be selective to remove the stressed region, which can be an implant damaged region and/or region having a higher concentration of hydrogen and/or like impurities. In a specific embodiment, etching can be wet and/or dry etching processes and the like. In a specific embodiment, the removing can also occur using thermal treatment the detached thickness of material to relax the stressed region. Alternatively, there can be a combination of etching and/or thermal treatment depending upon the embodiment.

Still further, the present invention provides a method for forming a film of material from a bulk semiconductor substrate, which uses an inherent bending characteristic of a cleaved material to facilitate separation from a remaining bulk substrate portion. In a specific embodiment, the method includes providing a semiconductor substrate having a surface region and a thickness. The method includes subjecting the surface region of the semiconductor substrate to a plurality of particles to form a cleave region, which is defined underlying the surface region to form a stressed region and to define a thickness of material to be detached. In a specific embodiment, the thickness of material has a thickness of about 20 microns and greater, but can be slightly thinner, as long as it is free standing. In a specific embodiment, the method includes initiating a separation of a portion of the thickness of material to be detached at an edge region of the cleave region using a selective energy placement at a spatial region within a vicinity of the cleave region to form a detached portion of the thickness of material having a portion of the stressed region. In a specific embodiment, the method includes bending away the detached portion of the thickness of material from the spatial region and causing a deformed shape in the thickness of material to be detach to facilitate removal of the thickness of material from a remaining substrate portion. In a specific embodiment, the energy can be selected from one or more sources such as a light source, a laser source, a thermal source, a radiation source, a mechanical source, a chemical source, a gravitational source, or a fluid source, e.g., gas, liquid, vapor, or combination. Of course, there can be other variations, modifications, and alternatives.

In still further embodiments, the present invention provides still another method for fabricating free standing thickness of materials using one or more semiconductor substrates. In a specific embodiment, the present method includes providing a semiconductor substrate having a surface region and a thickness. The method includes subjecting the surface region of the semiconductor substrate to a first plurality of high energy particles comprising D+species generated using a linear accelerator to form a plurality of gettering sites within a cleave region, which is provided beneath the surface region to defined a thickness of material to be detached. The method includes subjecting the semiconductor substrate to a treatment process according to a specific embodiment. The method includes subjecting the surface region of the semiconductor substrate to a second plurality of high energy particles comprising H2+ species using the linear accelerator, which is preferably the same linear accelerator as the one providing the D+ species. In a specific embodiment, the second plurality of high energy particles are provided to increase a stress level of the cleave region from a first stress level to a second stress level. The method includes initiating the cleaving action at a selected region of the cleave region to detach a portion of the thickness of detachable material using a cleaving process. The method includes freeing the thickness of detachable material.

Numerous benefits are achieved over pre-existing techniques using embodiments of the present invention. In particular, embodiments of the present invention use a cost effective linear accelerator device and method for providing a high energy implant process for layer transfer techniques. Such linear accelerator device may include, but is not limited to, a drift tube technique, a Radio Frequency Quadrupole, commonly called RFQ, or combinations of these, (for example, a RFQ combined with a Drift Tube Linac or a RFI (RF-Focused Interdigital) Linear Accelerator), DC accelerators, and other suitable techniques. In a preferred embodiment, the linear accelerator provides an implantation process that forms a thickness of transferable material defined by a cleave plane in a donor substrate. The thickness of transferable material may be further processed to provide a high quality semiconductor material for application such as photovoltaic devices, 3D MEMS or integrated circuits, IC packaging, semiconductor devices, silicon carbide and gallium nitride films for semiconductor and optoelectronic applications, any combination of these, and others. In a preferred embodiment, the present method provides for single crystal silicon for highly efficient photovoltaic cells among others. In a preferred embodiment, the present method and structure use a low initial dose of energetic particles, which allows the process to be cost effective and efficient. Additionally, the present method and structure allow for fabrication of large area substrates. It will be found that this invention can be applied to make thin silicon material plates of the desired form factor (for example, 50 um-200 um thickness with a area size from 12.5 cm×12.5 cm to upwards of 1 m×1 m or more for polysilicon plates). In an alternative preferred embodiment, embodiments according to the present invention may provide for a seed layer that can further provide for layering of a hetero-structure epitaxial process. The hetero-structure epitaxial process can be used to form thin multi-junction photovoltaic cells, among others. Merely as an example, GaAs and GaInP layers may be deposited heteroepitaxially onto a germanium seed layer, which is a transferred layer formed using an implant process according to an embodiment of the present invention. In a specific embodiment, the present method can be applied successively to cleaving multiple slices from a single ingot, e.g., silicon boule. That is, the method can be repeated to successively cleave slices (similar to cutting slices of bread from a baked loaf) according to a specific embodiment. Of course, there can be other variations, modifications, and alternatives.

Depending upon the embodiment, one or more of these benefits may be achieved. These and other benefits may be described throughout the present specification and more particularly below.

DETAILED DESCRIPTION OF THE INVENTION

Figure 1:
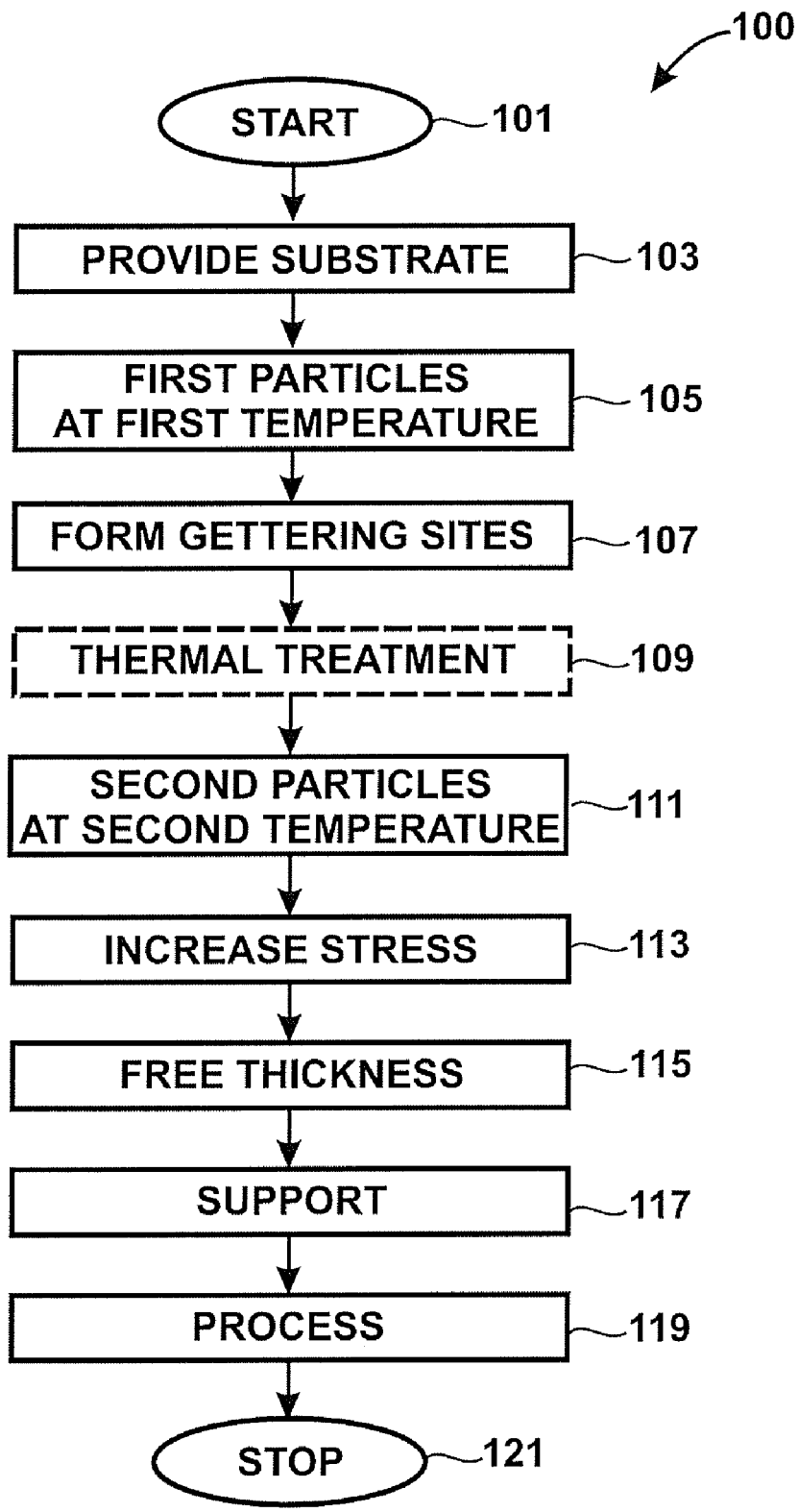
FIG. 1 is a simplified process flow illustrating a method of forming substrates using a thick layer transfer process according to an embodiment of the present invention.
Figure 2:
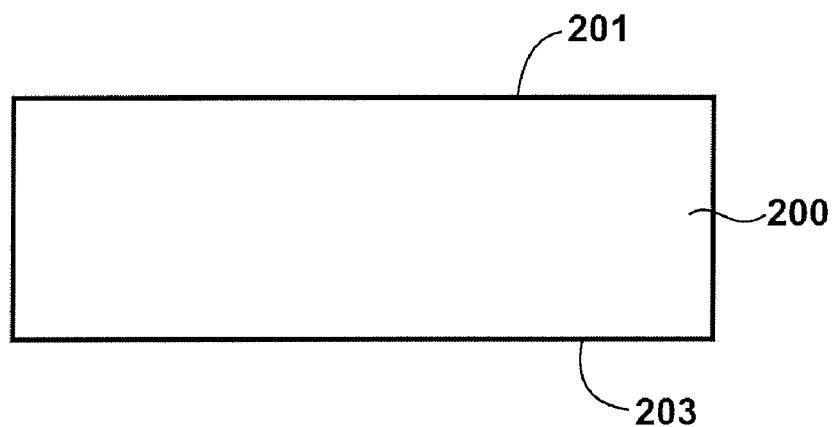
FIGS. 2-8 are simplified diagrams illustrating a method of forming substrates using a thick layer transfer process according to an embodiment of the present invention.

According to embodiments of the present invention, techniques including a method for forming substrates are provided. More particularly, embodiments according to the present invention provide a method to form a free standing layer of material from a semiconductor material. In a specific embodiment, the free standing layer of material is provided using a plurality of high energy particles to cause a formation of a cleave plane in the semiconductor substrate. The method according to present invent invention can be used in a variety of application, including but not limited to semiconductor device packaging, photovoltaic cells, MEMS devices, and others.

In a specific embodiment, a method for fabricating free standing thickness of materials using one or more semiconductor substrates is provided as follows:

1. Provide a semiconductor substrate having a surface region and a thickness;
2. Subject the surface region of the semiconductor substrate to a first plurality of high energy particles generated using a linear accelerator, the first plurality of high energy particles being provided at a first angle defined by direction of the first plurality of high energy particles and the surface region;
3. Form a region of a plurality of gettering sites within a cleave region, which is provided beneath the surface region to defined a thickness of material to be detached, while the cleave region is maintained at a first temperature;
4. Optionally, perform a thermal treatment process on the semiconductor substrate to further form the plurality of gettering sites within the cleave region;
5. Subject the surface region of the semiconductor substrate to a second plurality of high energy particles generated using the linear accelerator, the second plurality of high energy particles being provided at a second angle defined by direction of the second plurality of high energy particles and the surface region;
6. Increase a stress level of the cleave region from a first stress level to a second stress level from the second plurality of high energy particles, while the semiconductor substrate is maintained at a second temperature;
7. Free the thickness of detachable material, which is free standing, using a cleaving process, while the detachable material is free from an overlying support member or the like;
8. Place the thickness of detached material on a support member;
9. Perform one or more processes on the thickness of detached material;
10. Optionally, perform one or more processes on the semiconductor substrate before subjecting the surface region with the first plurality of high energy particles in step (2); and
11. Perform other steps as desired.

The above sequence of steps provide a method of forming substrates using a linear accelerator process according to an embodiment of the present invention. As shown, the method includes using a co-implant process to remove a film of material, which is preferably thick and free standing. Other alternatives can also be provided where steps may be added, one or more steps may be removed, or one or more steps may be provided in a different sequence without departing from the scope of the claims herein. For example, the high energy implant step 5 may optionally be substituted for any combination or single process including but not limited to a thermally activated liquid, plasma hydrogenation step, low energy implant and diffusion or other processes that allows the hydrogen to be introduced and by diffusion, accumulate within the gettering sites according to a specific embodiment. Further details of the present method can be found throughout the present specific and more particularly below.

FIGS. 2-8 are simplified diagrams illustrating a method of forming substrates using a thick layer transfer process according to an embodiment of the present invention. These diagrams are merely examples, which should not unduly limit the scope of the claims recited herein. One of ordinary skill in the art would recognize many variations, modifications, and alternatives. As shown, the method begins by providing a semiconductor substrate 200 having a surface region 201, a backside 203 and a thickness. Such thickness can be an entirety of an ingot or sliced from a larger ingot or the like. In a specific embodiment, the semiconductor substrate can be a single crystal silicon wafer, polysilicon cast wafer, tile, or substrate, silicon germanium wafer, germanium wafer, silicon carbide, group III/V materials, group II/VI materials, gallium nitride, or the like. In a preferred embodiment, the substrate can be a photosensitive material. Of course there can be other variations, modifications, and alternatives.

Figure 3:
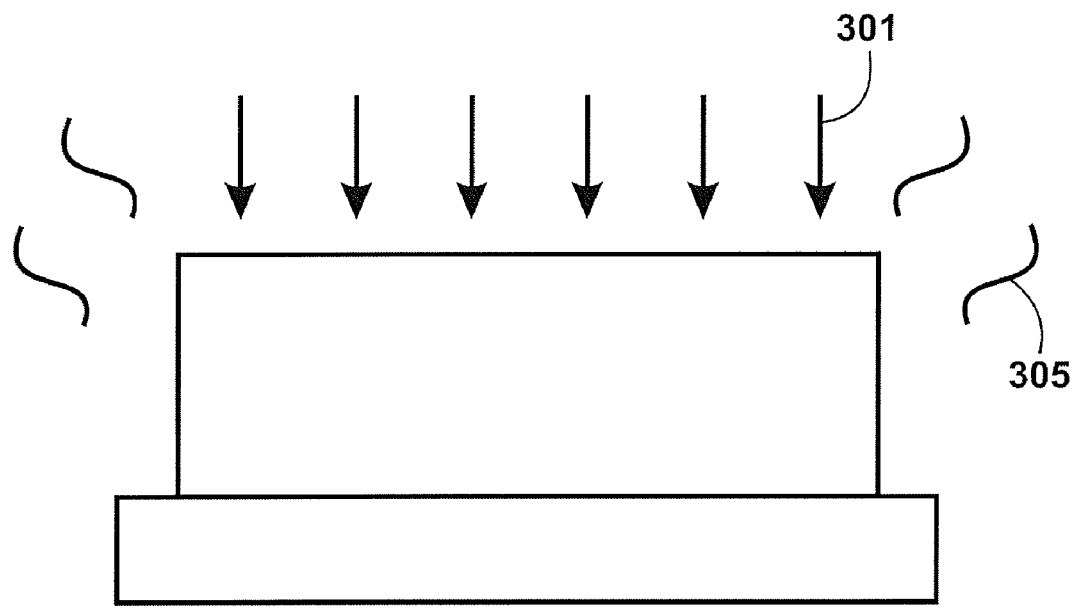
Figure 4:
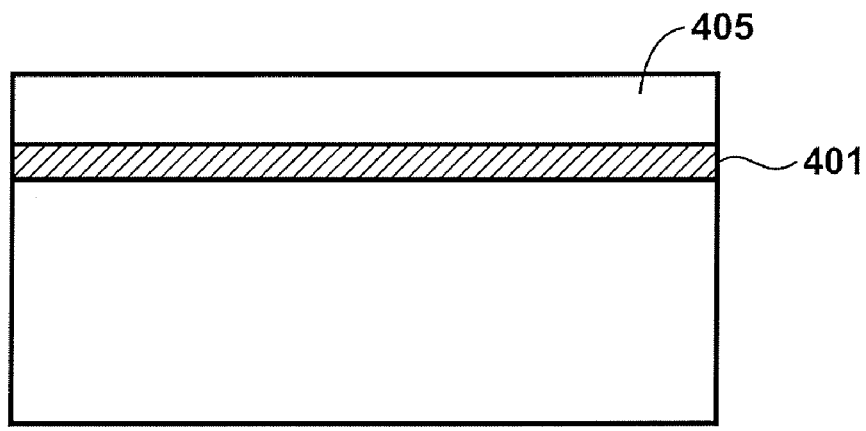

Referring to FIG. 3, the method includes subjecting the surface region of the semiconductor substrate to a first plurality of high energy particles 301 generated using a linear accelerator. In a specific embodiment, the particles cause formation of a plurality of gettering sites or an accumulation region within a cleave region 401, which is provided beneath the surface region to defined a thickness of material 405 to be detached, as shown in the simplified diagram of FIG. 4. Preferably, the first plurality of high energy particles provide an implant profile having a peak concentration and a base spatially disposed within a depth of the semiconductor substrate. Preferably, the base can have a width of about 2 Rp and less, where "Rp" is generally referred to as "a straggle" which is often used in characterizing width of an implant depth profile. In a preferred embodiment, the cleave region is maintained at a first temperature 305, which can be provided directly or indirectly. That is, the temperature can be provided by convection, conduction, radiation, or a combination of these techniques according to a specific embodiment. In a specific embodiment, the temperature can be provided using a rapid thermal process before, after, or even during a portion of time that the particles are being introduced. The rapid thermal process can be flood or patterned or a combination of these techniques. As merely an example, the rapid thermal process can be provided to achieve an optimized stress profile of displaced silicon atoms within the implant end-of-range layer where the stresses are maximized but where the selection of the rapid thermal process conditions did not overheat the layer to allow the hydrogen to escape and lower the getter efficiencies. For purposes of this invention, overheating will mean a temperature and time combination which has evolved the getter layer past a point of optimized effectiveness. Of course, there can be other variations, modifications, and alternatives.

Additionally, the high-energy particle beam may also provide part of the thermal energy and in combination with an external temperature source to achieve the desired implant temperature. In certain embodiment, the high-energy particle beam alone may provide the entire thermal energy desired for implant. That is, the high energy particle beam can be provided that directly causes energy to be converted into thermal energy to increase the temperature of the substrate. In a specific embodiment, the particles convert kinetic energy into thermal energy to increase a temperature of the substrate to a predetermined or desired amount. The particle beam can have scanning speed and spatial characteristics. Beam expansion from the original beam size can occur by rapid electromagnetic scanning but can also occur through drift of the beam over a distance where the beam will naturally expand to the desired beam diameter and beam flux spatial distribution. Of course there can be other variations, modifications, and alternatives.

Depending upon the application, smaller mass particles are generally selected to decrease the energy requirement for implantation to a desired depth in a material and to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1 \times 10^{15}$ to about $1 \times 10^{16}$ atoms/cm$^2$, and preferably the dose is less than about $5 \times 10^{16}$ atoms/cm$^2$. Implantation energy ranges from about 1 MeV and greater to about 2 MeV and greater for the formation of thick films useful for photovoltaic applications. Implantation temperature ranges from about −50 to about +50 Degrees Celsius, and is preferably less than about 450 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 50 micrometers to about 200 micrometers using proton implant energy ranges from about 2 MeV to about 5 MeV. Of course there can be other variations, modifications, and alternatives.

In a specific embodiment, a silicon film thickness ranges from about 50 um to about 200 um may be formed using a proton implant having an energy range of about 2.1 MeV to about 5 MeV. This range of silicon film thickness allows the detachment of a thickness of a single-crystal silicon substrate equivalent that can be used as a free standing silicon substrates. Single crystal silicon substrate in the thickness range of 50 um to 200 um may be used to replace present method of using wafer sawing, etching and polishing processes. As opposed to about 50% kerf loss in the present technologies (kerf loss as being defined as the material lost during the cutting and wafering operations), the implant cleaving technique has virtually no kerf loss resulting in substantial cost savings and material utilization efficiency improvements. Energies higher than 5 MeV may be used to make semiconductor processing alternative substrate materials, but in solar cell manufacturing, 200 um or less is desired for silicon solar cell material thickness for bulk silicon solar cell formation. As a result, thicker silicon substrates are not of particular commercial interest for fabricating solar cell according to a specific embodiment.

As an example, MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Tbragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

Figure 5:
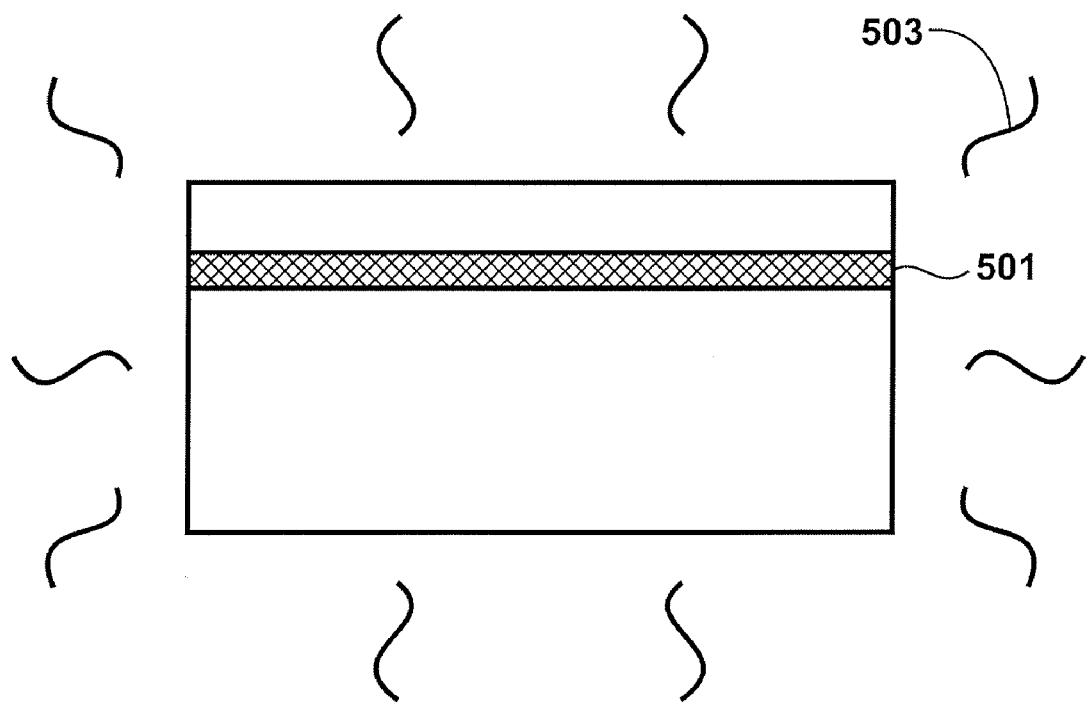

Referring now to FIG. 5, the present method performs a thermal treatment process 503 on the semiconductor substrate to further form the plurality of gettering sites within the cleave region. That is, the thermal treatment process anneals out and/or quenches the cleave region to fix 501 the plurality of first particles in place. The thermal treatment provides a fixed network of defects that can act as efficient sites for gettering and accumulating particles in a subsequent implantation or hydrogenation or combination of implantation and/or diffusion process. In a specific embodiment, the increased temperature is believed to precipitate a network of permanent defects and also traps a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below. In a preferred embodiment, the thermal treatment can occur using conduction, convection, radiation, or any combination of these techniques. The high-energy particle beam may also provide part of the thermal energy and in combination with an external temperature source to achieve the desired implant temperature. In certain embodiment, the high-energy particle beam alone may provide the entire thermal energy desired for implant. Of course, there can be other variations, modifications, and alternatives.

Figure 6:
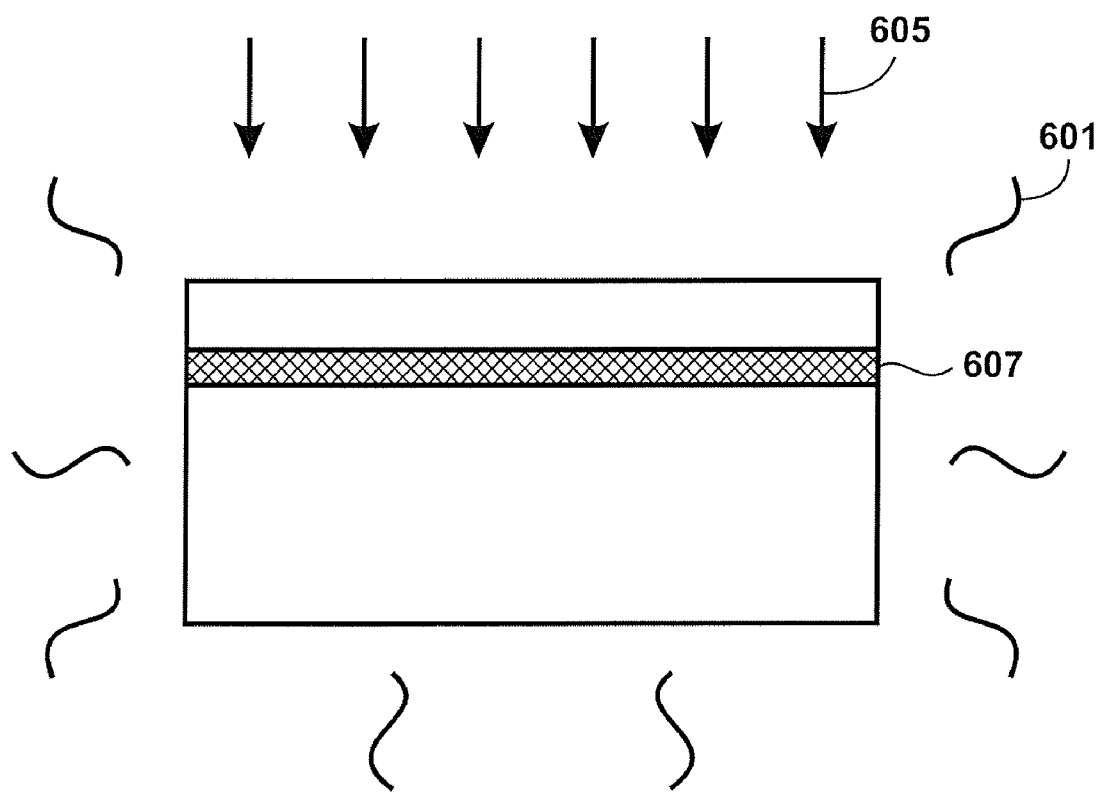

In a specific embodiment, the method includes subjecting the surface region of the semiconductor substrate to a second plurality of high energy particles generated using the linear accelerator, as illustrated in the simplified diagram of FIG. 6. As shown, the method includes the second plurality of high energy particles 605, which are provided in the semiconductor substrate. The second particles are introduced into the cleave region 607, which increases a stress level of the cleave region from a first stress level to a second stress level from the second plurality of high energy particles. In a specific embodiment, the second stress level is suitable for a subsequent cleaving process. In a preferred embodiment, the semiconductor substrate is maintained at a second temperature 601, which is higher than the first temperature.

Using hydrogen as the implanted species into the silicon wafer as an example, the implantation process is performed using a specific set of conditions. Implantation dose ranges from about $5 \times 10^{15}$ to about $5 \times 10^{16}$ atoms/cm$^2$, and preferably the dose is less than about $1-5 \times 10^{17}$ atoms/cm$^2$. Implantation energy ranges from about 1 MeV and greater to about 2 MeV and greater for the formation of thick films useful for photovoltaic applications. Implant dose rate can be provided at about 500 microamperes to about 50 milliamperes and a total dose rate can be calculated by integrating an implantation rate over the expanded beam area. Implantation temperature ranges from about −50 Degree Celsius to about 550 Degrees Celsius, and is preferably greater than about 350 Degrees Celsius for the accumulation step. The hydrogen ions can be selectively introduced into the silicon wafer to the selected depth at an accuracy of about ±0.03 to ±1.5 microns. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies as noted above, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 50 micrometers to about 100 micrometers or more, for example about 200 micrometers, using proton implant energy ranges from about 2 MeV to about 5 MeV. Of course there can be other variations, modifications, and alternatives.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing.

In a specific embodiment, the present method uses a mass-selected high-energy implant approach, which has the appropriate beam intensity. To be cost-effective, the implant beam current should be on the order of a few tens of milliamps of $H^+$ or $H^-$ ion beam current (if the system can implant such high energies, $H_2^+$ ions can also be advantageously utilized for achieving higher dose rates). Such apparatuses have been made recently available by the use of radio-frequency quadrupole linear accelerator (RFQ-Linac) or Drift-Tube Linac (DTL), or RF-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1\times10^{16} H/cm^2$ and an expanded beam of about 500 mm×500 mm, the area per hour is about 7 square meters while the power flux is kept to about 13 Watts/cm². This combination of parameters makes this approach particularly practical for cost effective solar cell production. In addition, electromagnetic beam scanning can favorably be utilized to control the effective beam characteristics. Of course, there can be other variations, alternatives, and modifications.

In a specific embodiment, the second plurality of particles can also be introduced using any combination of implantation and/or diffusion. In a specific embodiment, the second plurality of particles can be provided using any of the high energy implantation techniques described as well as others outside of the present specification. Such techniques can include, among others, ion shower, plasma immersion ion implantation, and other plasma treatment processes. Alternatively, certain low energy techniques, including diffusion, can be used to introduce the second plurality of particles into the gettering sites. As merely an example, hydrogen and/or other particles can be diffused into the gettering sites using a driving force such as convection, conduction, and/or radiation and/or any combination of these. Such driving force can be thermal, mechanical, chemical, and/or others depending upon the embodiment. As merely an example, such second plurality of particles can be introduced using plasma hydrogenation under heated target conditions or using an electrolytic (liquid hydrogenation) means. Alternatively, the plurality of particles can be introduced using a combination of implantation and/or diffusion according to a specific embodiment. Of course, there can be other variations, modifications, and alternatives.

Optionally, the method includes a thermal treatment process after the implanting process according to a specific embodiment. In a specific embodiment, the present method uses a thermal process ranging from about 450 to about 600 Degrees Celsius for silicon material. In a preferred embodiment, the thermal treatment can occur using conduction, convection, radiation, or any combination of these techniques. In a specific embodiment, the temperature can be provided using a rapid thermal process before, after, or even during a portion of time that the particles are being introduced. The rapid thermal process can be flood or patterned or a combination of these techniques. As merely an example, the rapid thermal process can be provided to achieve the desired chemical rearrangement of the silicon and hydrogen at the end-of-range region where a maximized displaced silicon atom distribution stress profile is realized without incurring excessive hydrogen out-diffusion. It is well known that rapid thermal annealing has such out diffusion limited thermal treatment benefits. Of course, there can be other variations, modifications, and alternatives.

In a specific embodiment, the high-energy particle beam may also provide part of the thermal energy and in combination with a external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

Figure 7:
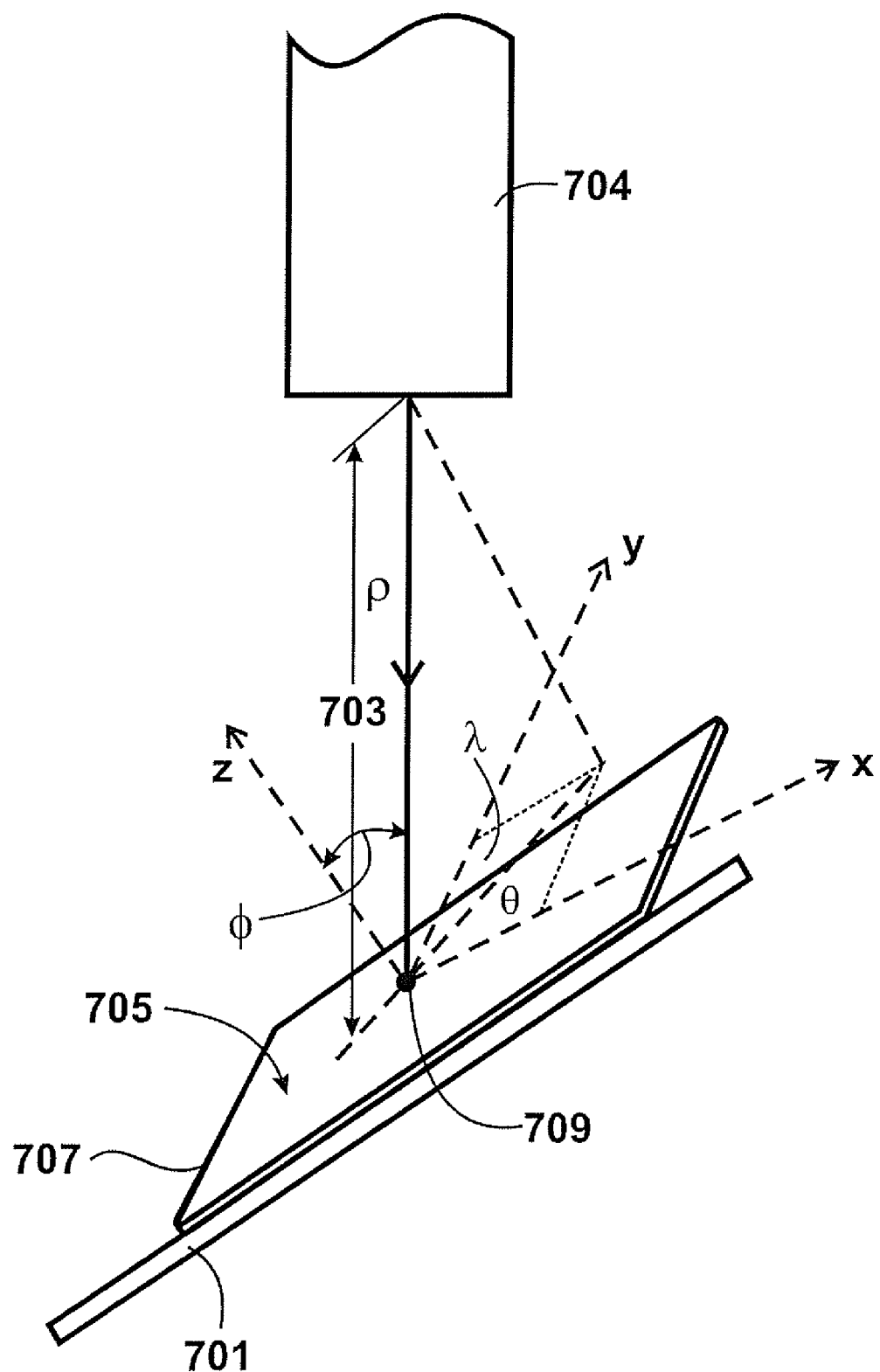

In a specific embodiment, the semiconductor substrate may be disposed on a tray device 701 as shown in FIG. 7. A plurality of high energy particles 703 generated in a linear accelerator 704 are introduced into a surface region 705 of a semiconductor substrate 707. Also shown in FIG. 7 is a reference spherical coordinate system ($\rho$, $\phi$, $\theta$). The z-axis is normal to the surface region of the semiconductor substrate, which defines the x-y plane of a Cartesian coordinate system. The origin of the reference spherical coordinates and the Cartesian coordinates is an entry point 709 of the plurality of high energy particles on the surface region of the substrate. The distance from an exit 711 of the plurality of high energy particles from the linear accelerator to the origin defines the radial distance $\rho$ in the spherical coordinates. The azimuth angle $\theta$ from the positive x-axis is also shown. The zenith angle $\phi$ between the plurality of high energy particles and the z-axis defines implant angle. In a specific embodiment, the tray device is configured to allow for a suitable implant angle. Specifically, the tray device can be tilted using two preset points and may be selected by a control device (e.g., a computer) according to a recipe. Of course there can be other variations, modifications, and alternatives.

Referring again to the present method of forming a free standing thickness of material, the first plurality of high energy particles may be provided at a first implant angle. The first implant angle may be provided at about zero to about 30 degrees. Such implant angle range allows for a high density network of gettering sites in a vicinity of a cleave plane within a thickness of the semiconductor substrate in a specific embodiment. The angle also can be chosen to minimize or in the alternative select a channeling implant regime that is compatible with the goal of achieving an optimized getter site layer. The second plurality of high energy particles may be provided at a second implant angle. The second implant angle is provided to allow for matching the channeling and the depth distribution of the second plurality of high energy particles to cause an optimized stress level in a crystalline plane in the vicinity of the cleave region. In a specific embodiment, the second implant angle can range from about zero degree to about 15 degree. In an alternative embodiment, the second implant angle can range from about zero to about less than eight degrees. As merely an example, the accumulation step may be maximized by matching the second implant peak concentration to the peak of the getter layer. It is well known that the depth of the defect distribution peak of an implant developed getter layer will be slightly shallower than the implanted hydrogen concentration peak. Using a constant energy implant, matching can occur when the second implant is made at a larger angle from surface normal than the first getter layer implant. Using a 2 MeV proton implantation as an example, a first implant damage peak will be about 1 um shallower than its peak hydrogen concentration (using SRIM 2003, this is approximately 47 um versus 48 um hydrogen peak where an orthogonal implant and no channeling is assumed). To maximize the accumulation of the second implant hydrogen, an implant angle of about 12 degrees would allow a shallower second accumulation implant to match the hydrogen concentration peak to the gettering layer. Of course the implant angle used depends on the application, one skilled in the art would recognize many variations, modifications, and alternatives.

Figure 8:
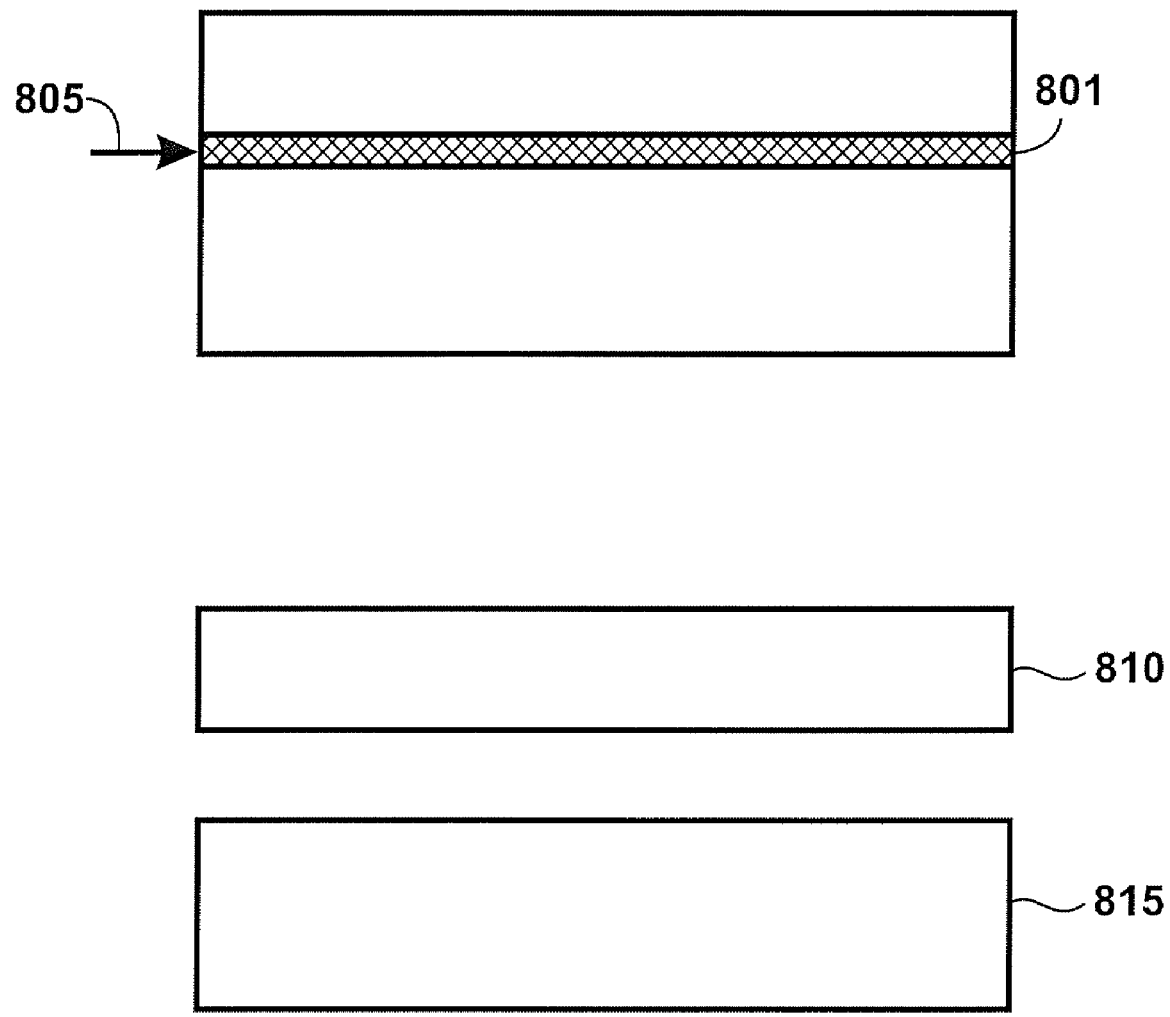

In a specific embodiment, the method includes a step of freeing 805 the thickness of detachable material, which is free standing, using a cleaving process along an implant plane 801 as shown in FIG. 8, while the detachable material is free from an overlying support member or the like, as also illustrated by FIG. 8. As shown, the detachable material 810 is removed from the remaining substrate portion 815. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method frees the thickness of material from the substrate to completely remove the thickness of material.

Figure 8A:
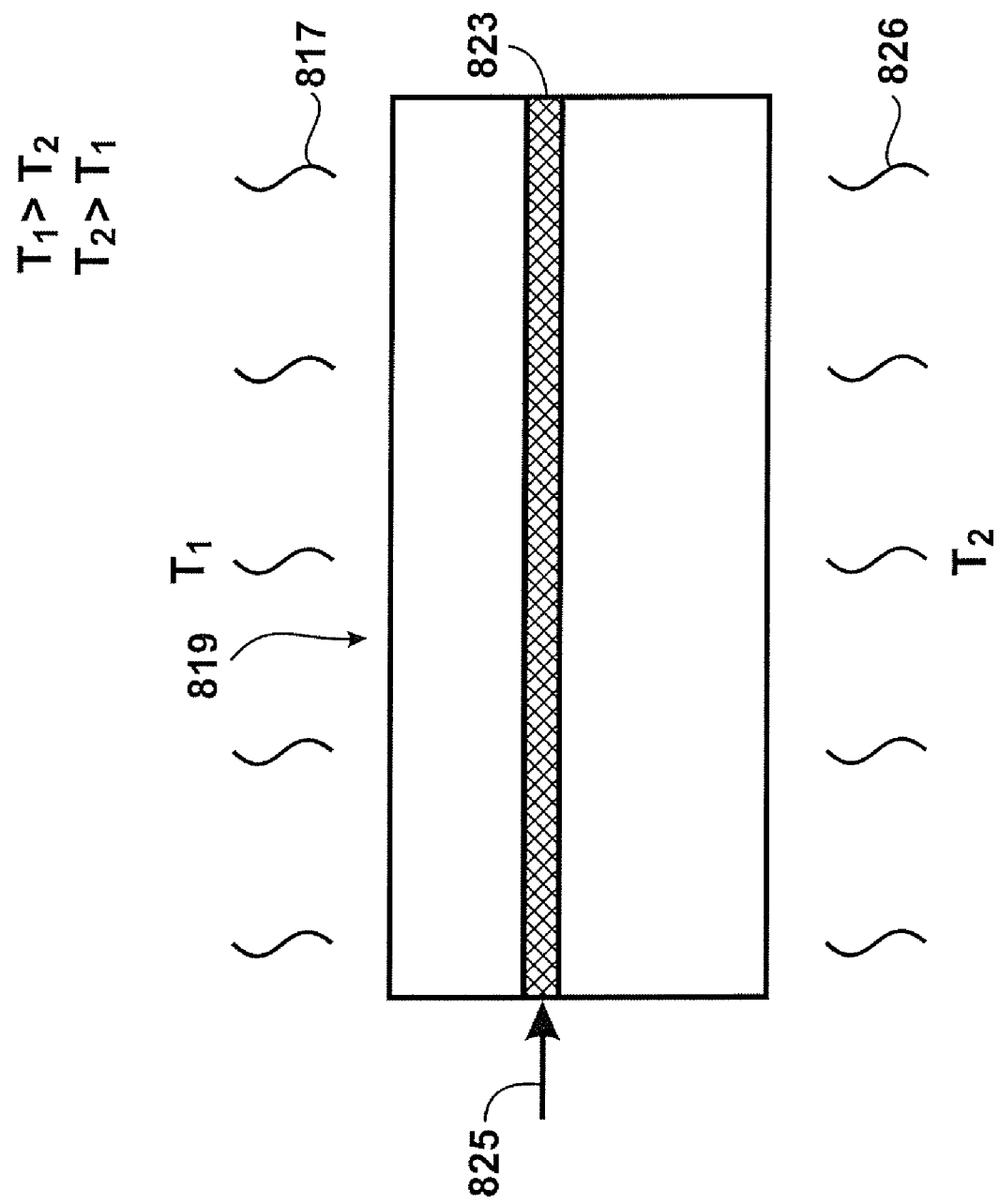
FIG. 8A is a simplified diagram illustrating cleaving using a thermal treatment process according to an embodiment of the present invention.
Figure 9:
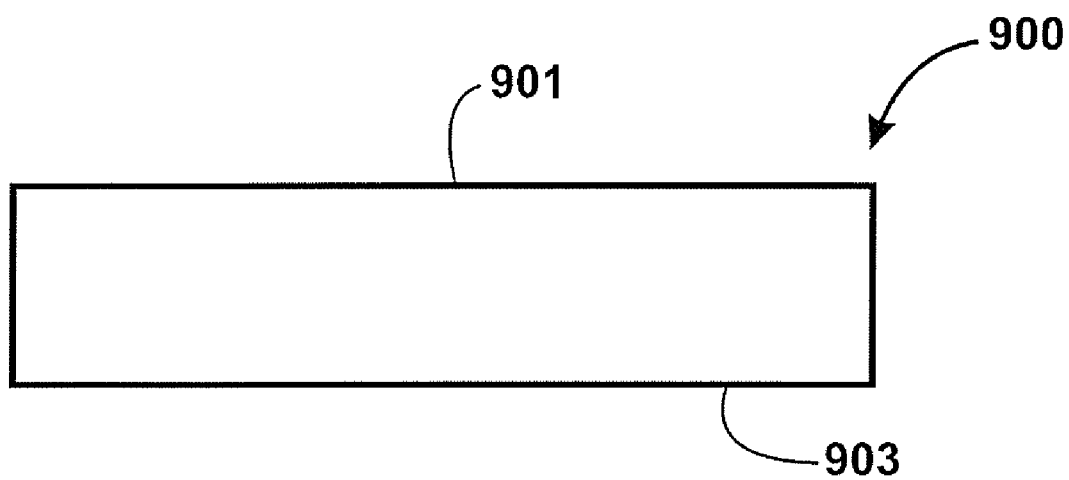
FIGS. 9-15 are simplified diagrams illustrating a method of forming substrates using patterned implants and a thick layer transfer process according to an embodiment of the present invention.

In a specific embodiment, the cleaving process can be performed by using a thermal treatment process 817 as shown in FIG. 8A. In a preferred embodiment, the thermal treatment process provides a thermal gradient in the thickness of the substrate and in particular causes stress to accumulate at the cleave region 823, which has been implanted or subjected to accumulation by a plurality of particles. In a specific embodiment, the thermal gradient may be achieved by providing a first temperature T1 in a surface region 819 of the semiconductor substrate and a second temperature T2 in a backside region 821 of the semiconductor substrate. Depending on the embodiment, T1 can be greater than T2 or alternatively T2 can greater than T1. The cleave region 823 is also shown. As merely an example, heating can be accomplished using a variety of techniques. Such techniques can include conduction, radiation, convection, or any combination of these. Conduction can include a hot plate or other contact device and the like or conduction using fluids and/or gases according to a specific embodiment. In an alternative embodiment, radiation can be used. Such radiation can include heat lamps, flash lamps, laser lamps, rapid thermal heating devices, and the like according to a specific embodiment. Alternatively, gases can be flowed overlying either or both surfaces to cause a temperature gradient in the cleave region. Alternatively, either of the surfaces can be cooled to a predetermined temperature to cause a thermal gradient across the cleave region. Cooling can occur using conduction, convection, radiation, or other techniques, similar to the heating techniques. Of course, there can be other variations, modifications, and alternatives.

In a specific embodiment, the cleaving process can be performed using a laser to provide the energy for cleaving. Using a laser, the selected region can be formed to allow the laser to penetrate through a portion of the substrate and allow for energy to be absorbed at a portion of the cleave region according to a specific embodiment. That is, the substrate and type of laser can be used to efficiently transfer electromagnetic radiation to form a thermal gradient at the cleave region. In another alternative specific embodiment, the cleaving process may be performed using a mechanical process. In a yet another alternative embodiment, the cleaving process may be performed using an acoustic process. In an alternative embodiment, cleaving can be initiated using any of the above processes or any combination of the above processes. Examples of such cleaving techniques can be found in U.S. Pat. No. 6,013,563, commonly assigned, and hereby incorporated by reference for all purposes. Of course, there can be other variations, alternatives, and modifications.

In a preferred embodiment, the present invention uses a high energy light source such as a laser source to initiate cleaving. In a specific embodiment, the laser source can be directed to a selected region of the cleave region and/or within a vicinity of the cleave region to cause a thermal gradient or further cause a thermal gradient to initiate a cleave action. The laser can be pulsed, and/or flashed and/or directed onto a spatial region according to a specific embodiment. As merely an example, the laser can be a Q-Switched Nd-YAG laser operated at the fundamental 1064 nm wavelength such as a HIPPO-106QW manufactured by a company called Newport Corporation, Irvine, Calif. Other types of laser devices such as carbon monoxide (CO), carbon dioxide ($CO_2$), Nd-YLF, free electronic electron lasers, and dye lasers can also be used. Depending upon the embodiment, an advantage of a laser wavelength operated near the target material band edge is considered advantageous since the EOR damage region and cleave plane hydrogen concentration can be much more absorptive to a near band-edge wavelength than the bulk material. In a specific embodiment, this would have the effect of increasing the heating component (e.g., peak temperature and thermal gradients) within the cleave plane region.

In a specific embodiment, the Nd-YAG 1064 nm wavelength is one such laser wavelength choice for silicon. In another embodiment, the 20 C absorption constant ($\alpha$ in $cm^{-1}$) in P-type doped, 5-10 ohm-cm crystalline single-crystal silicon is approximately 50 $cm^{-1}$ while the EOR absorption constant for an implant peak can increase to 1000-10,000 $cm^{-1}$ or more. This would allow most of the laser energy to be deposited within the cleave region according to a preferred embodiments. Other wavelengths can show similar absorption selectivity. Some specific wavelengths which are tuned to specific EOR chemical bond absorption peaks (e.g., such as the hydrogen-related bond absorption band in silicon at approximately 1800-2200 $cm^{-1}$) may also be used advantageously to optimize laser energy absorption within the cleave plane region. Such lasers may be free-electron laser that can be tuned, for example, to the Si—H bond absorption of approximately 4.8 um. Of course, there can be other variations, modifications, and alternatives.

In a specific embodiment, the present method can perform other processes. For example, the method can place the thickness of detached material on a support member, which is later processed. Additionally or optionally, the method performs one or more processes on the semiconductor substrate before subjecting the surface region with the first plurality of high energy particles. Depending upon the embodiment, the processes can be for the formation of photovoltaic cells, integrated circuits, optical devices, any combination of these, and the like. Of course, there can be other variations, modifications, and alternatives.

In an alternative specific embodiment, an alternative method for fabricating free standing thickness of materials using one or more semiconductor substrates is provided as follows:

1. Provide a semiconductor substrate having a surface region and a thickness;
2. Subject the surface region of the semiconductor substrate to a first patterned plurality of high energy particles generated using a linear accelerator, the first plurality of high energy particles being provided at a first angle defined by direction of the first plurality of high energy particles and the surface region;
3. Form a patterned region of a plurality of gettering sites within a cleave region, which is provided beneath the surface region to defined a thickness of material to be detached, while the cleave region is maintained at a first temperature;
4. Optionally, perform a thermal treatment process on the semiconductor substrate to further form the patterned plurality of gettering sites within the cleave region;
5. Subject the surface region of the semiconductor substrate to a second plurality of high energy particles generated using the linear accelerator, the second plurality of high energy particles being provided at a second angle defined by direction of the second plurality of high energy particles and the surface region;
6. Increase a stress level of the cleave region from a first stress level to a second stress level from the second plurality of high energy particles, while the semiconductor substrate is maintained at a second temperature;
7. Free the thickness of detachable material, which is free standing, using a cleaving process, while the detachable material is free from an overlying support member or the like;
8. Place the thickness of detached material on a support member;
9. Perform one or more processes on the thickness of detached material;
10. Optionally, perform one or more processes on the semiconductor substrate before subjecting the surface region with the first plurality of high energy particles in step (2); and
11. Perform other steps as desired.

The above sequence of steps provide a method of forming substrates using a linear accelerator process and a patterned implant according to an embodiment of the present invention. As shown, the method includes using a co-implant process to remove a film of material, which is preferably thick and free standing. Other alternatives can also be provided where steps may be added, one or more steps may be removed, or one or more steps may be provided in a different sequence without departing from the scope of the claims herein. Further details of the present method can be found throughout the present specific and more particularly below.

FIGS. 9-15 are simplified diagrams illustrating an alternative method of forming substrates using a thick layer transfer process according to an alternative embodiment of the present invention. These diagrams are merely examples, which should not unduly limit the scope of the claims recited herein. One of ordinary skill in the art would recognize many variations, modifications, and alternatives. As shown, the method begins by providing a semiconductor substrate 900 having a surface region 901, a backside 903 and a thickness. Such thickness can be an entirety of an ingot or sliced from a larger ingot or the like. In a specific embodiment, the semiconductor substrate can be a single crystal silicon wafer, polysilicon cast wafer, tile, or substrate, silicon germanium wafer, germanium wafer, group III/V materials, group II/VI materials, silicon carbide, gallium nitride, or the like. In a preferred embodiment, the substrate can be a photosensitive material. Of course there can be other variations, modifications, and alternatives.

Figure 10:
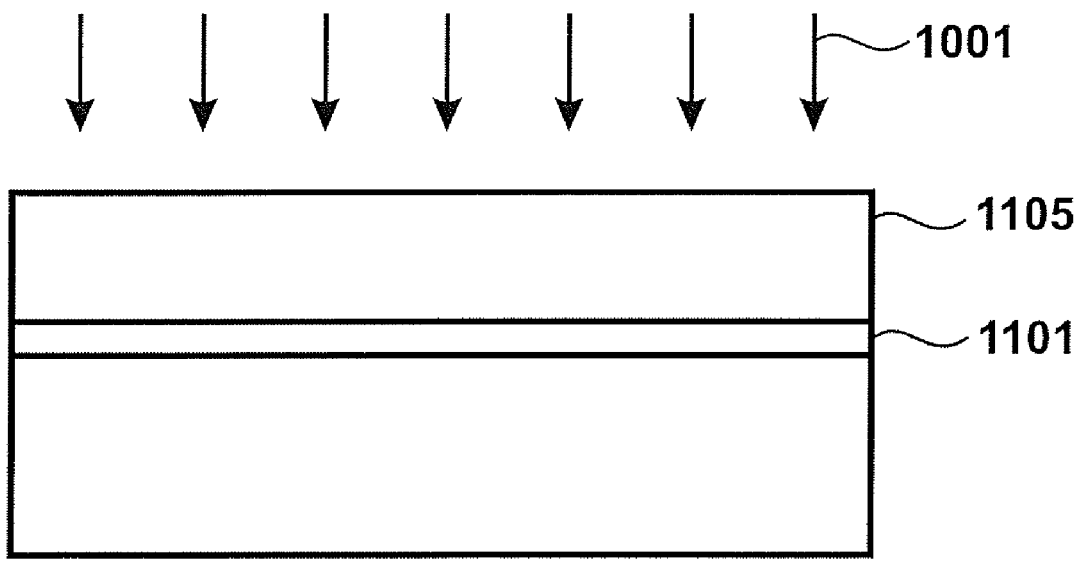
Figure 11:
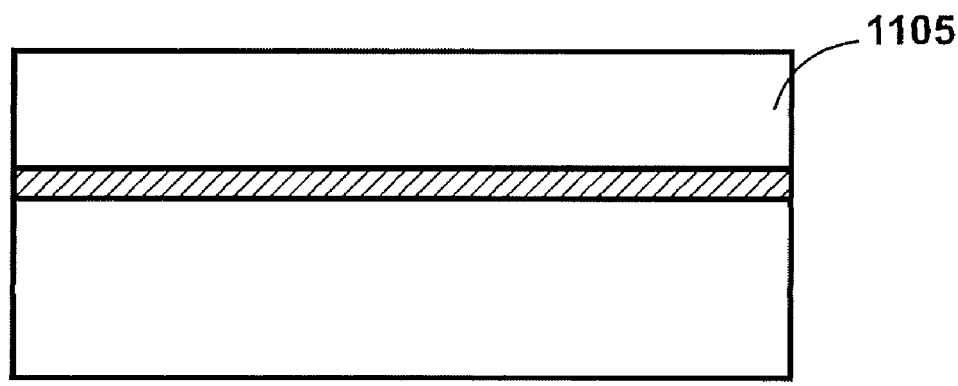

Referring to FIG. 10, the method includes subjecting the surface region of the semiconductor substrate to a first plurality of high energy particles 1001 generated using a linear accelerator. In a specific embodiment, the particles cause formation of a plurality of gettering sites or an accumulation region within a cleave region 1101, which is provided beneath the surface region to defined a thickness of material 1105 to be detached, as shown in the simplified diagram of FIG. 11. Preferably, the first plurality of high energy particles provide an implant profile having a peak concentration and a base spatially disposed within a depth of the semiconductor substrate. Preferably, the base can have a width of about 2 Rp and less. In a preferred embodiment, the cleave region is maintained at a first temperature 1105, which can be provided directly or indirectly. That is, the temperature can be provided by convection, conduction, radiation, or a combination of these techniques according to a specific embodiment. In a specific embodiment, the temperature can be provided using a rapid thermal process before, after, or even during a portion of time that the particles are being introduced. The rapid thermal process can be flood or patterned or a combination of these techniques. As merely an example, the rapid thermal process can be provided to achieve an optimized stress profile of displaced silicon atoms within the implant end-of-range layer where the stresses are maximized but where the selection of the rapid thermal process conditions did not overheat the layer to allow the hydrogen to escape and lower the getter efficiencies. For purposes of this invention, overheating will mean a temperature and time combination which has evolved the getter layer past a point of optimized effectiveness. Of course, there can be other variations, modifications, and alternatives.

Additionally, the high-energy particle beam may also provide part of the thermal energy and in combination with an external temperature source to achieve the desired implant temperature. In certain embodiment, the high-energy particle beam alone may provide the entire thermal energy desired for implant. That is, the high energy particle beam can be provided that directly causes energy to be converted into thermal energy to increase the temperature of the substrate. In a specific embodiment, the particles convert kinetic energy into thermal energy to increase a temperature of the substrate to a predetermined or desired amount. Of course there can be other variations, modifications, and alternatives.

Depending upon the application, smaller mass particles are generally selected to decrease the energy requirement for implantation to a desired depth in a material and to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1\times10^{15}$ to about $1\times10^{16}$ atoms/cm$^2$, and preferably the dose is less than about $5\times10^{16}$ atoms/cm$^2$. Implantation energy ranges from about 1 MeV and greater to about 2 MeV and greater for the formation of thick films useful for photovoltaic applications. Implantation temperature ranges from about −50 to about +50 Degrees Celsius, and is preferably less than about 450 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program. In a specific embodiment, the silicon film thickness ranges from about 50 micrometers to about 200 micrometers using proton implant energy ranges from about 2 MeV to about 5 MeV. Of course there can be other variations, modifications, and alternatives.

In a specific embodiment, a silicon film thickness ranges from about 50 um to about 200 um may be formed using a proton implant having an energy range of about 2.1 MeV to about 5 MeV. This range of silicon film thickness allows the detachment of a thickness of a single-crystal silicon substrate equivalent that can be used as a free standing silicon substrates. Single crystal silicon substrate in the thickness range of 50 um to 200 um may be used to replace present method of using wafer sawing, etching and polishing processes. As opposed to about 50% kerf loss in the present technologies (kerf loss as being defined as the material lost during the cutting and wafering operations), the implant cleaving technique has virtually no kerf loss resulting in substantial cost savings and material utilization efficiency improvements. Energies higher than 5 MeV may be used to make semiconductor processing alternative substrate materials, but in solar cell manufacturing, 200 um or less is desired for silicon solar cell material thickness for bulk silicon solar cell formation. As a result, thicker silicon substrates are not of particular commercial interest for fabricating solar cell according to a specific embodiment.

As an example, MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

Figure 12A:
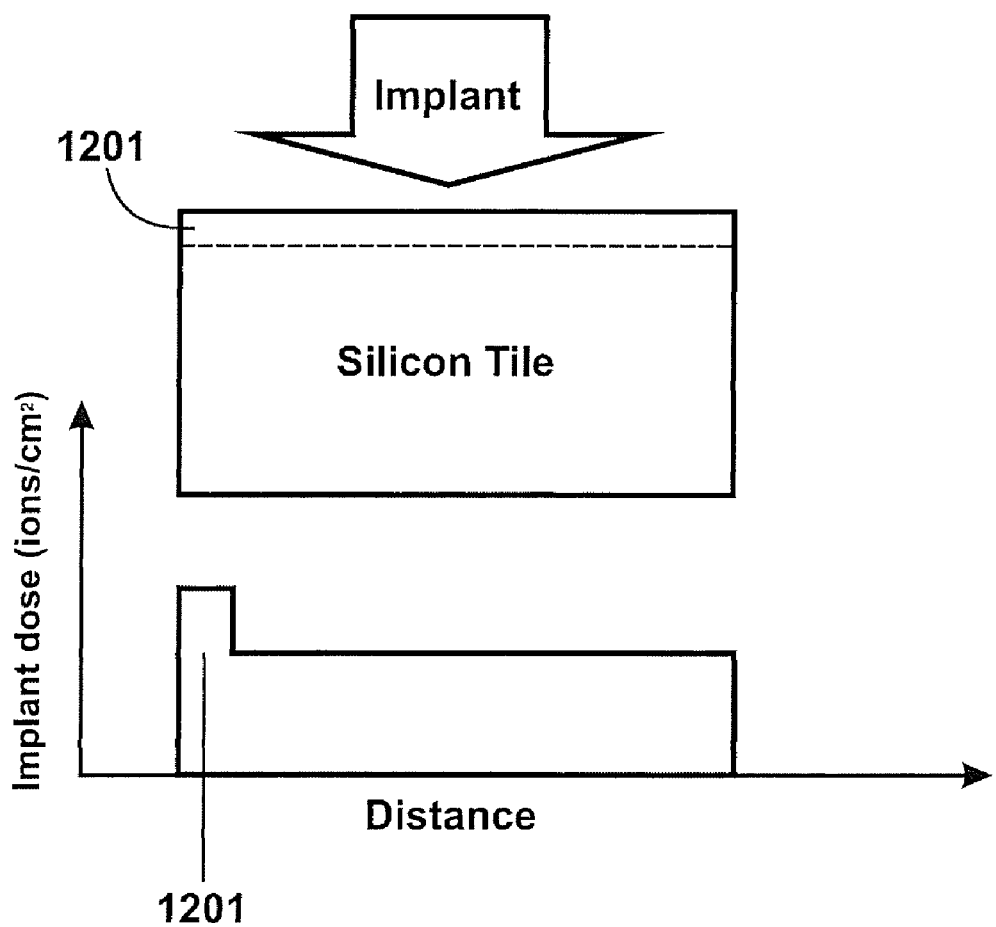

In a specific embodiment, the present method performs a patterned implant of a first and/or second plurality of particles. As shown, after the patterned implant, a selected region will have a higher dose of impurities to facilitate initiation of a cleaving action. That is, the selected region is selected to be within the periphery 1201 of the substrate in this example as shown in FIG. 12(A). In a specific embodiment, the higher dose can be 2-5×10$^{16}$ cm$^{-2}$ and the lower dose can range from about 0.5-2×10$^{16}$ cm$^{-2}$ and less. In a specific embodiment, the patterned implant is provided in a spatial manner along an edge area as shown. Alternatively, the patterned implant can be along a z-direction, which is also illustrated. Of course, there can be other variations, modifications, and alternatives.

Figure 12B:
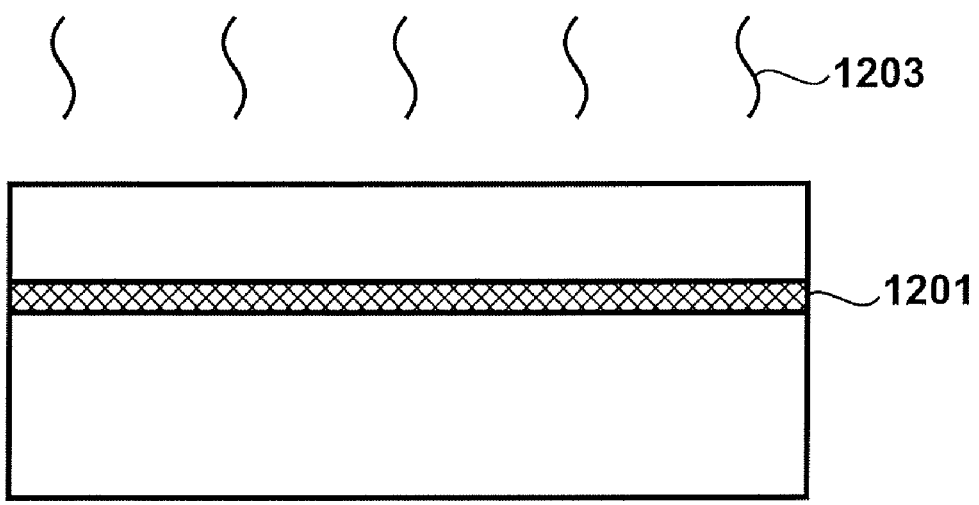

Referring now to FIG. 12(B), the present method performs a thermal treatment process 1203 on the semiconductor substrate to further form the plurality of gettering sites within the cleave region. That is, the thermal treatment process anneals out and/or quenches the cleave region to fix 1201 the plurality of first particles in place. The thermal treatment provides a fixed network of defects that can act as efficient sites for gettering and accumulating particles in a subsequent implantation process. In a specific embodiment, the increased temperature is believed to precipitate a network of permanent defects and also traps a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below. In a preferred embodiment, the thermal treatment can occur using conduction, convection, radiation, or any combination of these techniques. The high-energy particle beam may also provide part of the thermal energy and in combination with a external temperature source to achieve the desired implant temperature. In certain embodiment, the high-energy particle beam alone may provide the entire thermal energy desired for implant. Of course, there can be other variations, modifications, and alternatives.

Figure 13:
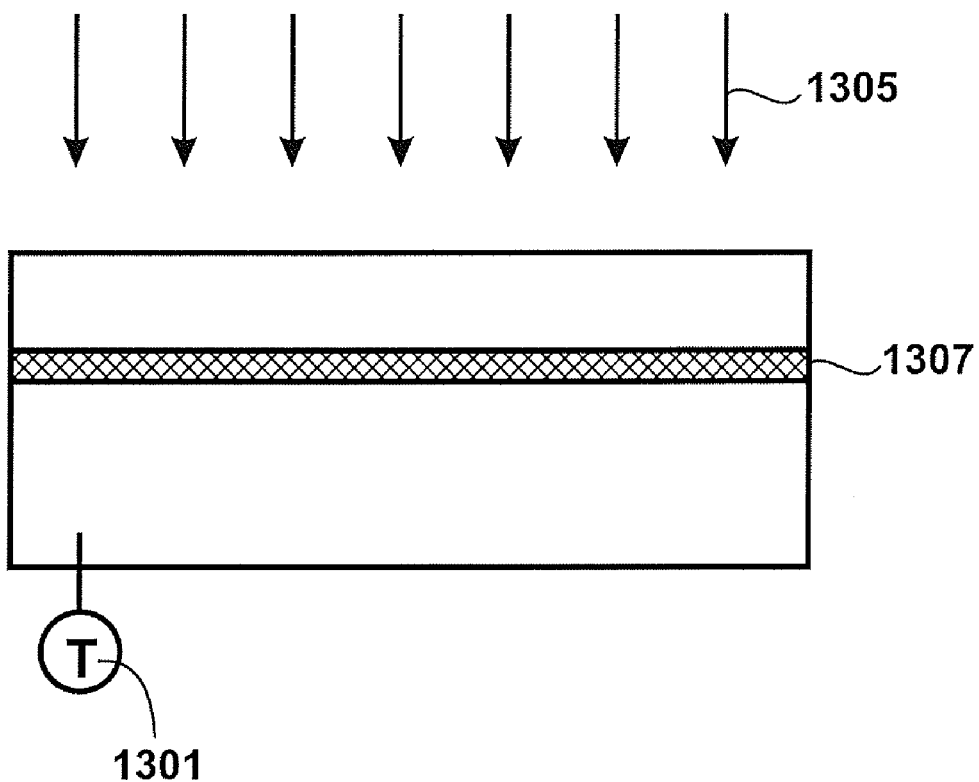

In a specific embodiment, the method includes subjecting the surface region of the semiconductor substrate to a second plurality of high energy particles generated using the linear accelerator, as illustrated in the simplified diagram of FIG. 13. As shown, the method includes the second plurality of high energy particles 1305, which are provided in the semiconductor substrate. The second particles are introduced into the cleave region 1307, which increases a stress level of the cleave region from a first stress level to a second stress level from the second plurality of high energy particles. In a specific embodiment, the second stress level is suitable for a subsequent cleaving process. In a preferred embodiment, the semiconductor substrate is maintained at a second temperature 1301, which is higher than the first temperature.

Using hydrogen as the implanted species into the silicon wafer as an example, the implantation process is performed using a specific set of conditions. Implantation dose ranges from about $5 \times 10^{15}$ to about $5 \times 10^{16}$ atoms/cm$^2$, and preferably the dose is less than about $1\text{-}5 \times 10^{17}$ atoms/cm$^2$. Implantation energy ranges from about 1 MeV and greater to about 2 MeV and greater for the formation of thick films useful for photovoltaic applications. Implant dose rate can be provided at about 500 microamperes to about 50 milliamperes and a total dose rate can be calculated by integrating an implantation rate over the expanded beam area. Implantation temperature ranges from about −50 Degree Celsius to about 550 Degrees Celsius, and is preferably greater than about 400 Degrees Celsius. The hydrogen ions can be selectively introduced into the silicon wafer to the selected depth at an accuracy of about ±0.03 to ±1.5 microns. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies as noted above, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 50 micrometers to about 100 micrometers or more, for example about 200 micrometers, using proton implant energy ranges from about 2 MeV to about 5 MeV. Of course there can be other variations, modifications, and alternatives.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing.

In a specific embodiment, the present method uses a mass-selected high-energy implant approach, which has the appropriate beam intensity. To be cost-effective, the implant beam current should be on the order of a few tens of milliamps of H$^+$ or H$^-$ ion beam current (if the system can implant such high energies, H$^{2+}$ ions can also be advantageously utilized for achieving higher dose rates). Such apparatuses has been made recently available by the use of radio-frequency quadrupole linear accelerator (RFQ-Linac) or Drift-Tube Linac (DTL), or RF-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1 \times 10^{16}$ H/cm$^2$ and an expanded beam of about 500 mm×500 mm, the area per hour is about 7 square meters while the power flux is kept to about 13 Watts/cm$^2$. This combination of parameters makes this approach particularly practical for cost effective solar cell production. Of course, there can be other variations, alternatives, and modifications.

In a specific embodiment, the second plurality of particles can also be introduced using any combination of implantation and/or diffusion. In a specific embodiment, the second plurality of particles can be provided using any of the high energy implantation techniques described as well as others outside of the present specification. Such techniques can include, among others, ion shower, plasma immersion ion implantation, and other plasma treatment processes. Alternatively, certain low energy techniques, including diffusion, can be used to introduce the second plurality of particles into the gettering sites. As merely an example, hydrogen and/or other particles can be diffused into the gettering sites using a driving force such as convection, conduction, and/or radiation and/or any combination of these. Such driving force can be thermal, mechanical, chemical, and/or others depending upon the embodiment. As merely an example, such second plurality of particles can be introduced using plasma hydrogenation under heated target conditions or using an electrolytic (liquid hydrogenation) means or other implant and/or diffusion techniques. Of course, there can be other variations, modifications, and alternatives.

Optionally, the method includes a thermal treatment process after the implanting process according to a specific embodiment. In a specific embodiment, the present method uses a thermal process ranging from about 450 to about 600 Degrees Celsius for silicon material. In a preferred embodiment, the thermal treatment can occur using conduction, convection, radiation, or any combination of these techniques. In a specific embodiment, the temperature can be provided using a rapid thermal process before, after, or even during a portion of time that the particles are being introduced. The rapid thermal process can be flood or patterned or a combination of these techniques. As merely an example, the rapid thermal process can be provided to achieve an optimized stress profile of displaced silicon atoms within the implant end-of-range layer where the stresses are maximized but where the selection of the rapid thermal process conditions did not overheat the layer to allow the hydrogen to escape and lower the getter efficiencies. For purposes of this invention, overheating will mean a temperature and time combination which has evolved the getter layer past a point of optimized effectiveness. Of course, there can be other variations, modifications, and alternatives.

In a specific embodiment, the high-energy particle beam may also provide part of the thermal energy and in combination with a external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

Figure 14:
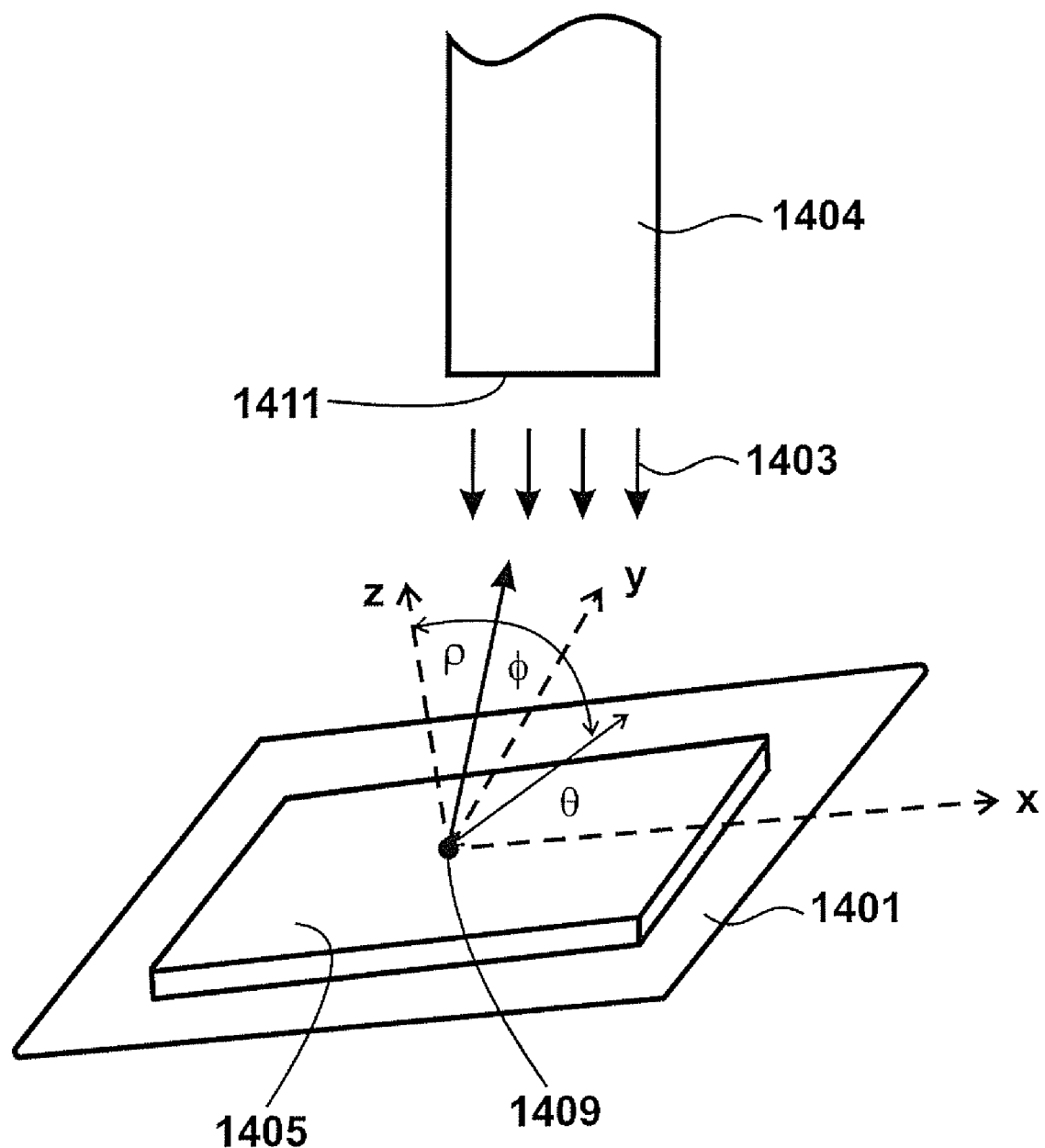

In a specific embodiment, the semiconductor substrate may be disposed on a tray device 1401 as shown in FIG. 14. A plurality of high energy particles 1403 generated in a linear accelerator 1404 are introduced into a surface region 1405 of a semiconductor substrate 1407. Also shown in FIG. 14 is a reference spherical coordinate system ($\rho$, $\phi$, $\theta$). The z-axis is normal to the surface region of the semiconductor substrate, which defines the x-y plane of a Cartesian coordinate system. The origin of the reference spherical coordinates and the Cartesian coordinates is an entry point 1409 of the plurality of high energy particles on the surface region of the substrate. The distance from an exit 1411 of the plurality of high energy particles from the linear accelerator to the origin defines the radial distance $\rho$ in the spherical coordinates. The azimuth angle $\theta$ from the positive x-axis is also shown. The zenith angle $\phi$ between the plurality of high energy particles and the z-axis defines implant angle. In a specific embodiment, the tray device is configured to allow for a suitable implant angle. Specifically, the tray device can be tilted using two preset points and may be selected by a control device (e.g., a computer) according to a recipe. Of course there can be other variations, modifications, and alternatives.

Referring again to the present method of forming a free standing thickness of material, the first plurality of high energy particles may be provided at a first implant angle. The first implant angle may be provided at about zero to about 30 degrees. Such implant angle range allows for a high density network of gettering sites in a vicinity of a cleave plane within a thickness of the semiconductor substrate in a specific embodiment. The second plurality of high energy particles may be provided at a second implant angle. The second implant angle is provided to allow for channeling of the second plurality of high energy particles to cause a stress level in a crystalline plane in the vicinity of the cleave region. In a specific embodiment, the second implant angle can range from about zero degree to about 15 degree. In an alternative embodiment, the second implant angle can range from about zero to about less than eight degrees. Of course the implant angle used depends on the application, one skilled in the art would recognize many variations, modifications, and alternatives.

In a specific embodiment, the present method performs a patterned implant of a second plurality of particles. After implantation of the second plurality of particles, an selected region will have a higher dose of impurities to facilitate initiation of a cleaving action. That is, the selected region is selected to be within a periphery of the substrate in a specific embodiment. In a specific embodiment, the higher dose can be $2\text{-}5\times10^{16}$ cm$^{-2}$ and the lower dose can range from about $0.5\text{-}2\times10^{16}$ cm$^{-2}$ and less. In a specific embodiment, the patterned implant is provided in a spatial manner along an edge area as shown. Alternatively, the patterned implant can be along a z-direction, which is also illustrated. Of course, there can be other variations, modifications, and alternatives.

Figure 15:
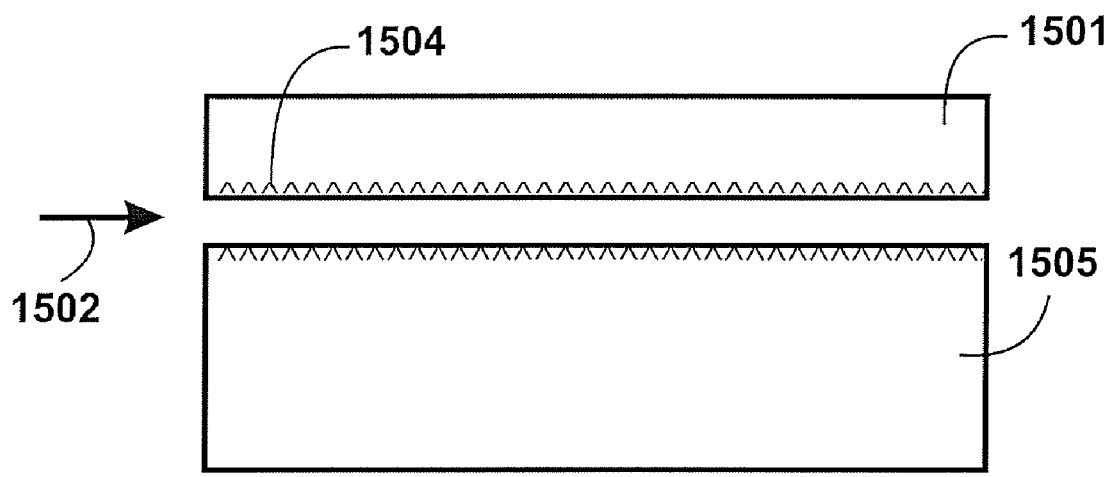
Figure 16:
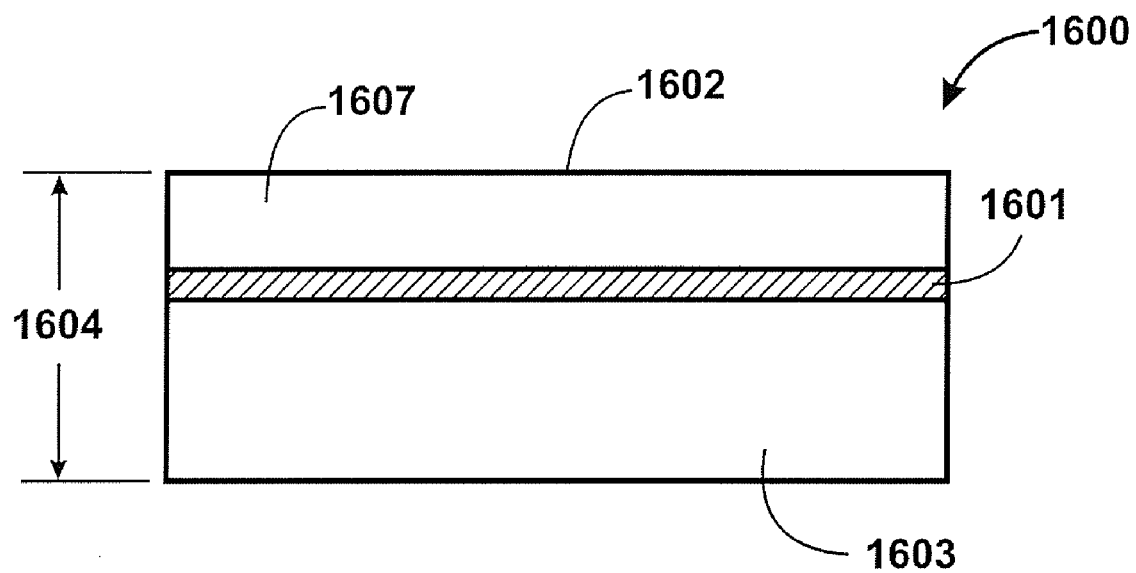
FIGS. 16-20 are simplified diagrams illustrating an alternative method of forming substrates using a post cleave processing of a thick layer transfer according to an embodiment of the present invention.

In a specific embodiment, the method includes a step of freeing 1502 the thickness of detachable material, which is free standing, using a cleaving process along an implant plane 1504 as shown in FIG. 15, while the detachable material is free from an overlying support member or the like, as also illustrated by FIG. 15. As shown, the detachable material 1501 is removed from the remaining substrate portion 1505. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method frees the thickness of material from the substrate to completely remove the thickness of material. Of course, there can be other variations, alternatives, and modifications.

In a specific embodiment, the present method can perform other processes. For example, the method can place the thickness of detached material on a support member, which is later processed. Additionally or optionally, the method performs one or more processes on the semiconductor substrate before subjecting the surface region with the first plurality of high energy particles. Depending upon the embodiment, the processes can be for the formation of photovoltaic cells, integrated circuits, optical devices, any combination of these, and the like. Of course, there can be other variations, modifications, and alternatives.

In yet an alternative specific embodiment, an alternative method for fabricating free standing thickness of materials using one or more semiconductor substrates is provided as follows:

1. Provide a semiconductor substrate having a surface region and a thickness;
2. Subject the surface region of the semiconductor substrate to a first patterned plurality of high energy particles generated using a linear accelerator, the first plurality of high energy particles being provided at a first angle defined by direction of the first plurality of high energy particles and the surface region;
3. Form a patterned region of a plurality of gettering sites within a cleave region, which is provided beneath the surface region to defined a thickness of material to be detached, while the cleave region is maintained at a first temperature;
4. Optionally, perform a thermal treatment process on the semiconductor substrate to further form the patterned plurality of gettering sites within the cleave region;
5. Subject the surface region of the semiconductor substrate to a second plurality of high energy particles generated using the linear accelerator, the second plurality of high energy particles being provided at a second angle defined by direction of the second plurality of high energy particles and the surface region;
6. Increase a stress level of the cleave region from a first stress level to a second stress level from the second plurality of high energy particles, while the semiconductor substrate is maintained at a second temperature;
7. Free the thickness of detachable material, which is free standing, using a cleaving process, while the detachable material is free from an overlying support member or the like and a remaining portion of stressed material (e.g., implant damaged material, doped material, hydrogen doped material) is still attached to the thickness of material even after the thickness of material has been detached;
8. Provide the thickness of detached material, which is free standing, and deformed in shape;
9. Process the detached material to remove a portion of any remaining stressed material;
10. Yield a substantially planar thickness of material that is flat in shape and is substantially free from the portion of stressed material;
11. Place the thickness of detached material on a support member;
12. Perform one or more processes on the thickness of detached material;
13. Optionally, perform one or more processes on the semiconductor substrate before subjecting the surface region with the first plurality of high energy particles in step (2); and
14. Perform other steps as desired.

The above sequence of steps provide a method of forming substrates using a linear accelerator process and a patterned implant according to an embodiment of the present invention. As shown, the method includes using a co-implant process to remove a film of material, which is preferably thick and free standing. Other alternatives can also be provided where steps may be added, one or more steps may be removed, or one or more steps may be provided in a different sequence without departing from the scope of the claims herein. Alternatively, the present method also provides a technique for removing any deformation from the detached thickness of material using one or more processes techniques. Further details of the present method can be found throughout the present specific and more particularly below.

FIGS. 16-20 are simplified diagrams illustrating an alternative method of forming substrates using a post cleave processing of a thick layer transfer according to an embodiment of the present invention. These diagrams are merely examples, which should not unduly limit the scope of the claims recited herein. One of ordinary skill in the art would recognize many variations, modifications, and alternatives. As shown, the method begins by providing a semiconductor substrate 1600 having a surface region 1602, a backside 1603 and a thickness 1604. Such thickness can be an entirety of an ingot or sliced from a larger ingot or the like. In a specific embodiment, the semiconductor substrate can be a single crystal silicon wafer, polysilicon cast wafer, tile, or substrate, silicon germanium wafer, germanium wafer, group III/V materials, group II/VI materials, silicon carbide, gallium nitride, or the like. In a preferred embodiment, the substrate can be a photosensitive material. Of course there can be other variations, modifications, and alternatives.

In a specific embodiment, the method includes subjecting the surface region of the semiconductor substrate to a first plurality of high energy particles generated using a linear accelerator. In a specific embodiment, the particles cause formation of a plurality of gettering sites or an accumulation region within a cleave region 1601, which is provided beneath the surface region to defined a thickness of material 1607 to be detached, as shown in the simplified diagram of FIG. 16. Preferably, the first plurality of high energy particles provide an implant profile having a peak concentration and a base spatially disposed within a depth of the semiconductor substrate. Preferably, the base can have a width of about 2 Rp and less. In a preferred embodiment, the cleave region is maintained at a first temperature, which can be provided directly or indirectly. That is, the temperature can be provided by convection, conduction, radiation, or a combination of these techniques according to a specific embodiment. In a specific embodiment, the temperature can be provided using a rapid thermal process before, after, or even during a portion of time that the particles are being introduced. The rapid thermal process can be flood or patterned or a combination of these techniques. As merely an example, the rapid thermal process can be provided to achieve an optimized stress profile of displaced silicon atoms within the implant end-of-range layer where the stresses are maximized but where the selection of the rapid thermal process conditions did not overheat the layer to allow the hydrogen to escape and lower the getter efficiencies. For purposes of this invention, overheating will mean a temperature and time combination which has evolved the getter layer past a point of optimized effectiveness. Of course, there can be other variations, modifications, and alternatives.

Additionally, the high-energy particle beam may also provide part of the thermal energy and in combination with an external temperature source to achieve the desired implant temperature. In certain embodiment, the high-energy particle beam alone may provide the entire thermal energy desired for implant. That is, the high energy particle beam can be provided that directly causes energy to be converted into thermal energy to increase the temperature of the substrate. In a specific embodiment, the particles convert kinetic energy into thermal energy to increase a temperature of the substrate to a predetermined or desired amount. Of course there can be other variations, modifications, and alternatives.

Depending upon the application, smaller mass particles are generally selected to decrease the energy requirement for implantation to a desired depth in a material and to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1\times10^{15}$ to about $1\times10^{16}$ atoms/cm$^2$, and preferably the dose is less than about $5\times10^{16}$ atoms/cm$^2$. Implantation energy ranges from about 1 MeV and greater to about 2 MeV and greater for the formation of thick films useful for photovoltaic applications. Implantation temperature ranges from about −50 to about +50 Degrees Celsius, and is preferably less than about 450 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 50 micrometers to about 200 micrometers using proton implant energy ranges from about 2 MeV to about 5 MeV. Of course there can be other variations, modifications, and alternatives.

In a specific embodiment, a silicon film thickness ranges from about 50 um to about 200 um may be formed using a proton implant having an energy range of about 2.1 MeV to about 5 MeV. This range of silicon film thickness allows the detachment of a thickness of a single-crystal silicon substrate equivalent that can be used as a free standing silicon substrates. Single crystal silicon substrate in the thickness range of 50 um to 200 um may be used to replace present method of using wafer sawing, etching, and polishing processes. As opposed to about 50% kerf loss in the present technologies (kerf loss as being defined as the material lost during the cutting and wafering operations), the implant cleaving technique has virtually no kerf loss resulting in substantial cost savings and material utilization efficiency improvements. Energies higher than 5 MeV may be used to make semiconductor processing alternative substrate materials, but in solar cell manufacturing, 200 um or less is desired for silicon solar cell material thickness for bulk silicon solar cell formation. As a result, thicker silicon substrates are not of particular commercial interest for fabricating solar cell according to a specific embodiment.

As an example, MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

In a specific embodiment, which may be optional, the present method performs a patterned implant of a first and/or second plurality of particles. As shown, after the patterned implant, a selected region will have a higher dose of impurities to facilitate initiation of a cleaving action. That is, the selected region is selected to be within the periphery of the substrate in this example as described above. In a specific embodiment, the higher dose can be $2\text{-}5\times10^{16}$ cm$^{-2}$ and the lower dose can range from about $0.5\text{-}2\times10^{16}$ cm$^{-2}$ and less. In a specific embodiment, the patterned implant is provided in a spatial manner along an edge area as shown. Alternatively, the patterned implant can be along a z-direction, which is also illustrated.

Certain embodiments of the present invention may employ one or more patterned regions to facilitate initiation of a cleaving action. Such approaches may include subjecting the surface region of the semiconductor substrate to a first plurality of high energy particles generated from a linear accelerator, to form a patterned region of a plurality of gettering sites within a cleave region. In one embodiment of a method according to the present invention, the cleave region is provided beneath the surface region to defined a thickness of material to be detached. The semiconductor substrate is maintained at a first temperature. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. The method includes initiating the cleaving action at a selected region of the patterned region to detach a portion of the thickness of detachable material using a cleaving process and freeing the thickness of detachable material using a cleaving process. Such a patterned implant sequence subjects the surface to a dose variation, where the initiation area is usually developed using a higher dose and/or thermal budget sequence. Propagation of the cleaving action to complete the cleaving action can occur using: (i) additional dosed regions to guide the propagating cleave front, (ii) stress control to guide a depth that is cleaved, and/or (iii) a natural crystallographic cleave plane. Some or most of the area may be implanted at a lesser dose (or not implanted at all) depending on the particular cleaving technique used. Such lower dosed regions can help improve overall productivity of the implantation system by reducing the total dose needed to detach each film from the substrate. According to a specific embodiment, generation of the higher-dosed initiation area can be facilitated by the use of the implantation beam itself to simultaneously increase the area dose, while heating the region and preparing the region for localized film detachment. The detachment can be accomplished in-situ during the implantation beam process, or after implantation using a separate thermal process step. Use of a sensor to measure and feed back the state of the initiation region, may be helpful to allow precise and controlled localized film detachment and avoid overheating or damaging the layer immediately after cleaving has occurred. Of course, there can be other variations, modifications, and alternatives.

Again as previously described, the present method performs a thermal treatment process on the semiconductor substrate to further form the plurality of gettering sites within the cleave region. That is, the thermal treatment process anneals out and/or quenches the cleave region to fix the plurality of first particles in place. The thermal treatment provides a fixed network of defects that can act as efficient sites for gettering and accumulating particles in a subsequent implantation process. In a specific embodiment, the increased temperature is believed to precipitate a network of permanent defects and also traps a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below. In a preferred embodiment, the thermal treatment can occur using conduction, convection, radiation, or any combination of these techniques. The high-energy particle beam may also provide part of the thermal energy and in combination with a external temperature source to achieve the desired implant temperature. In certain embodiment, the high-energy particle beam alone may provide the entire thermal energy desired for implant. Of course, there can be other variations, modifications, and alternatives.

In a specific embodiment, the method includes subjecting the surface region of the semiconductor substrate to a second plurality of high energy particles generated using the linear accelerator. As shown, the method includes the second plurality of high energy particles, which are provided in the semiconductor substrate. The second particles are introduced into the cleave region, which increases a stress level of the cleave region from a first stress level to a second stress level from the second plurality of high energy particles. In a specific embodiment, the second stress level is suitable for a subsequent cleaving process. In a preferred embodiment, the semiconductor substrate is maintained at a second temperature, which is higher than the first temperature.

Using hydrogen as the implanted species into the silicon wafer as an example, the implantation process is performed using a specific set of conditions. Implantation dose ranges from about $5 \times 10^{15}$ to about $5 \times 10^{16}$ atoms/cm$^2$, and preferably the dose is less than about $1-5 \times 10^{17}$ atoms/cm$^2$. Implantation energy ranges from about 1 MeV and greater to about 2 MeV and greater for the formation of thick films useful for photovoltaic applications. Implant dose rate can be provided at about 500 microamperes to about 50 milliamperes and a total dose rate can be calculated by integrating an implantation rate over the expanded beam area. Implantation temperature ranges from about −50 Degree Celsius to about 550 Degrees Celsius, and is preferably greater than about 400 Degrees Celsius. The hydrogen ions can be selectively introduced into the silicon wafer to the selected depth at an accuracy of about ±0.03 to ±1.5 microns. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies as noted above, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 50 micrometers to about 100 micrometers or more, for example about 200 micrometers, using proton implant energy ranges from about 2 MeV to about 5 MeV. Of course there can be other variations, modifications, and alternatives.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing.

In a specific embodiment, the present method uses a mass-selected high-energy implant approach, which has the appropriate beam intensity. To be cost-effective, the implant beam current should be on the order of a few tens of milliamps of H$^+$ or H$^-$ ion beam current (if the system can implant such high energies, H$_2^+$ ions can also be advantageously utilized for achieving higher dose rates). Such apparatuses have been made recently available by the use of radio-frequency quadrupole linear accelerator (RFQ-Linac) or Drift-Tube Linac (DTL), or RF-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1\times10^{16}$H/cm$^2$ and an expanded beam of about 500 mm×500 mm, the area per hour is about 7 square meters while the power flux is kept to about 13 Watts/cm$^2$. This combination of parameters makes this approach particularly practical for cost effective solar cell production. Of course, there can be other variations, alternatives, and modifications.

In a specific embodiment, the second plurality of particles can also be introduced using any combination of implantation and/or diffusion. In a specific embodiment, the second plurality of particles can be provided using any of the high energy implantation techniques described as well as others outside of the present specification. Such techniques can include, among others, ion shower, plasma immersion ion implantation, and other plasma treatment processes. Alternatively, certain low energy techniques, including diffusion, can be used to introduce the second plurality of particles into the gettering sites. As merely an example, hydrogen and/or other particles can be diffused into the gettering sites using a driving force such as convection, conduction, and/or radiation and/or any combination of these. Such driving force can be thermal, mechanical, chemical, and/or others depending upon the embodiment. As merely an example, such second plurality of particles can be introduced using plasma hydrogenation under heated target conditions or using an electrolytic (liquid hydrogenation) means or other implant and/or diffusion techniques. Of course, there can be other variations, modifications, and alternatives.

Optionally, the method includes a thermal treatment process after the implanting process according to a specific embodiment. In a specific embodiment, the present method uses a thermal process ranging from about 450 to about 600 Degrees Celsius for silicon material. In a preferred embodiment, the thermal treatment can occur using conduction, convection, radiation, or any combination of these techniques. In a specific embodiment, the temperature can be provided using a rapid thermal process before, after, or even during a portion of time that the particles are being introduced. The rapid thermal process can be flood or patterned or a combination of these techniques. As merely an example, the rapid thermal process can be provided to achieve an optimized stress profile of displaced silicon atoms within the implant end-of-range layer where the stresses are maximized but where the selection of the rapid thermal process conditions did not overheat the layer to allow the hydrogen to escape and lower the getter efficiencies. For purposes of this invention, overheating will mean a temperature and time combination which has evolved the getter layer past a point of optimized effectiveness. Of course, there can be other variations, modifications, and alternatives.

In a specific embodiment, the high-energy particle beam may also provide part of the thermal energy and in combination with a external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

In a specific embodiment, the semiconductor substrate may again be disposed on a tray device, as previously described. A plurality of high energy particles generated in a linear accelerator are introduced into a surface region of a semiconductor substrate. Depending upon the embodiment, a reference spherical coordinate system ($\rho$, $\phi$, $\theta$) can be used. The z-axis is normal to the surface region of the semiconductor substrate, which defines the x-y plane of a Cartesian coordinate system. The origin of the reference spherical coordinates and the Cartesian coordinates is an entry point of the plurality of high energy particles on the surface region of the substrate. The distance from an exit of the plurality of high energy particles from the linear accelerator to the origin defines the radial distance $\rho$ in the spherical coordinates. The azimuth angle $\theta$ from the positive x-axis is also shown. The zenith angle $\phi$ between the plurality of high energy particles and the z-axis defines implant angle. In a specific embodiment, the tray device is configured to allow for a suitable implant angle. Specifically, the tray device can be tilted using two preset points and may be selected by a control device (e.g., a computer) according to a recipe. Of course there can be other variations, modifications, and alternatives.

Referring again to the present method of forming a free standing thickness of material, the first plurality of high energy particles may be provided at a first implant angle. The first implant angle may be provided at about zero to about 30 degrees. Such implant angle range allows for a high density network of gettering sites in a vicinity of a cleave plane within a thickness of the semiconductor substrate in a specific embodiment. The second plurality of high energy particles may be provided at a second implant angle. The second implant angle is provided to allow for channeling of the second plurality of high energy particles to cause a stress level in a crystalline plane in the vicinity of the cleave region. In a specific embodiment, the second implant angle can range from about zero degree to about 15 degree. In an alternative embodiment, the second implant angle can range from about zero to about less than eight degrees. Of course the implant angle used depends on the application, one skilled in the art would recognize many variations, modifications, and alternatives.

In a specific embodiment, the present method performs a patterned implant of a second plurality of particles. After implantation of the second plurality of particles, an selected region will have a higher dose of impurities to facilitate initiation of a cleaving action. That is, the selected region is selected to be within a periphery of the substrate in a specific embodiment. In a specific embodiment, the higher dose can be $2\text{-}5\times10^{16}$ cm$^{-2}$ and the lower dose can range from about $0.5\text{-}2\times10^{16}$ cm$^{-2}$ and less. In a specific embodiment, the patterned implant is provided in a spatial manner along an edge area as shown. Alternatively, the patterned implant can be along a z-direction, which is also illustrated. Of course, there can be other variations, modifications, and alternatives.

Figure 17:
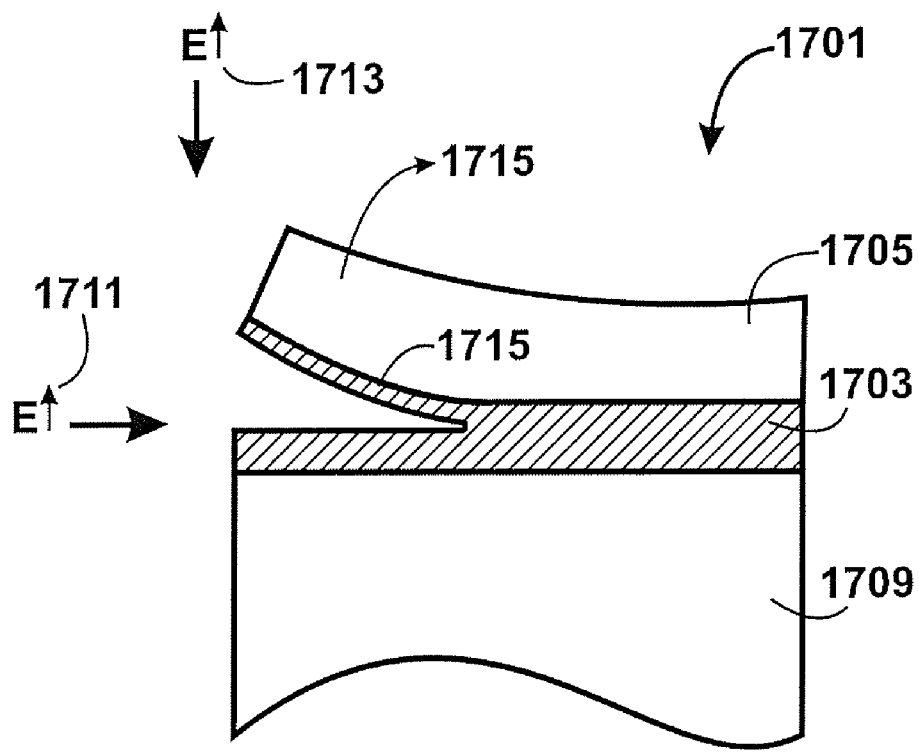

In a specific embodiment, the method includes a step of freeing 1701 the thickness of detachable material, which is free standing, using a cleaving process along an implant plane 1703 as shown in FIG. 17, while the detachable material is free from an overlying support member or the like, also as illustrated by FIG. 17. As shown, the detachable material 1705 is removed from the remaining substrate portion 1709. In a specific embodiment, the step of freeing can be performed using a controlled cleaving process. The controlled cleaving process provides a selected energy 1711, 1713 within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method frees the thickness of material from the substrate to completely remove the thickness of material. Of course, there can be other variations, alternatives, and modifications.

In a preferred embodiment, cleaving occurs using characteristics of the thickness of material to be detached. That is, the method includes freeing the thickness of detachable material using a cleaving process while maintaining a portion 1715 of the stress region attached to the thickness of material to cause the thickness of material to be characterized by a deformed shape, e.g., curled at edges or end regions. In a further embodiment, the present invention provides a method for forming a film of material from a bulk semiconductor substrate, which uses an inherent bending characteristic of a cleaved material to facilitate separation from a remaining bulk substrate portion, as also illustrated by FIG. 17. In a specific embodiment, the method includes providing a semiconductor substrate 1701 having a surface region and a thickness. In the present embodiment, like reference numbers are used but should not be limiting the scope of the claims herein. The method includes subjecting the surface region of the semiconductor substrate to a plurality of particles to form a cleave region, which is defined underlying the surface region to form a stressed region and to define a thickness of material to be detached. In a specific embodiment, the thickness of material has a thickness of about 20 microns and greater, but can be slightly thinner, as long as it is free standing. Of course, there can be other variations, modifications, and alternatives.

In a specific embodiment, the method includes initiating a separation of a portion of the thickness of material to be detached at an edge region of the cleave region using a selective energy placement 1711, 1703 at a spatial region within a vicinity of the cleave region to form a detached portion of the thickness of material having a portion of the stressed region. In a specific embodiment, the method includes bending away 1715 the detached portion of the thickness of material from the spatial region and causing a deformed shape in the thickness of material to be detach to facilitate removal of the thickness of material from a remaining substrate portion. In a specific embodiment, the energy can be selected from one or more sources such as a light source, a laser source, a thermal source, a radiation source, a mechanical source, a chemical source, a gravitational source, or a fluid source, e.g., gas, liquid, vapor, or combination. In certain embodiments, the liquid or gas can be a heating source or a cold source (i.e. cryogenic) to impart thermal stresses to the film in a controlled fashion.

In a specific embodiment, optionally, the method forms an overlying layer (not shown) to further facilitate a bending action to enhance the cleaving action. In a specific embodiment, the overlying layer is also stressed but causes a bending action. Such stress can be compressive according to a specific embodiment. A suitable material (e.g., dielectric, silicon nitride) can be used to create the compressive characteristic according to an embodiment of the present invention. After cleaving, the overlying layer can be removed or can remain on the surface region. Of course, there can be other variations, modifications, and alternatives. Further details of the present method can be found throughout the present specification and more particularly below.

Figure 18:
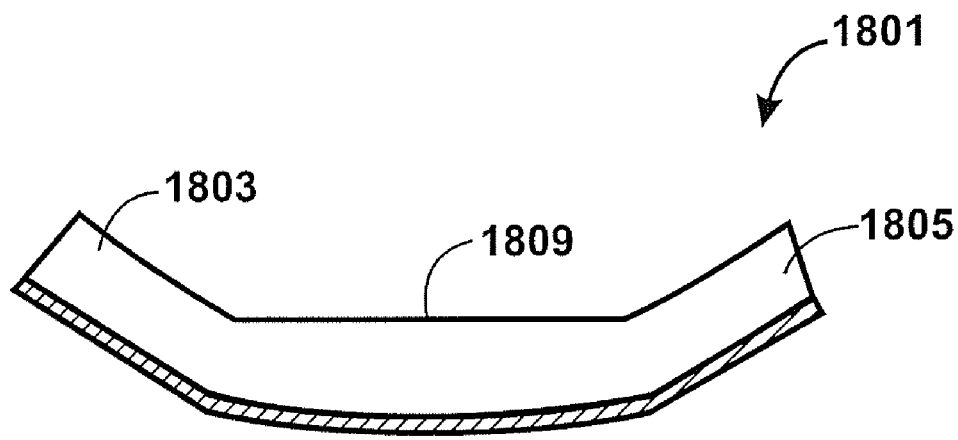
Figure 18A:
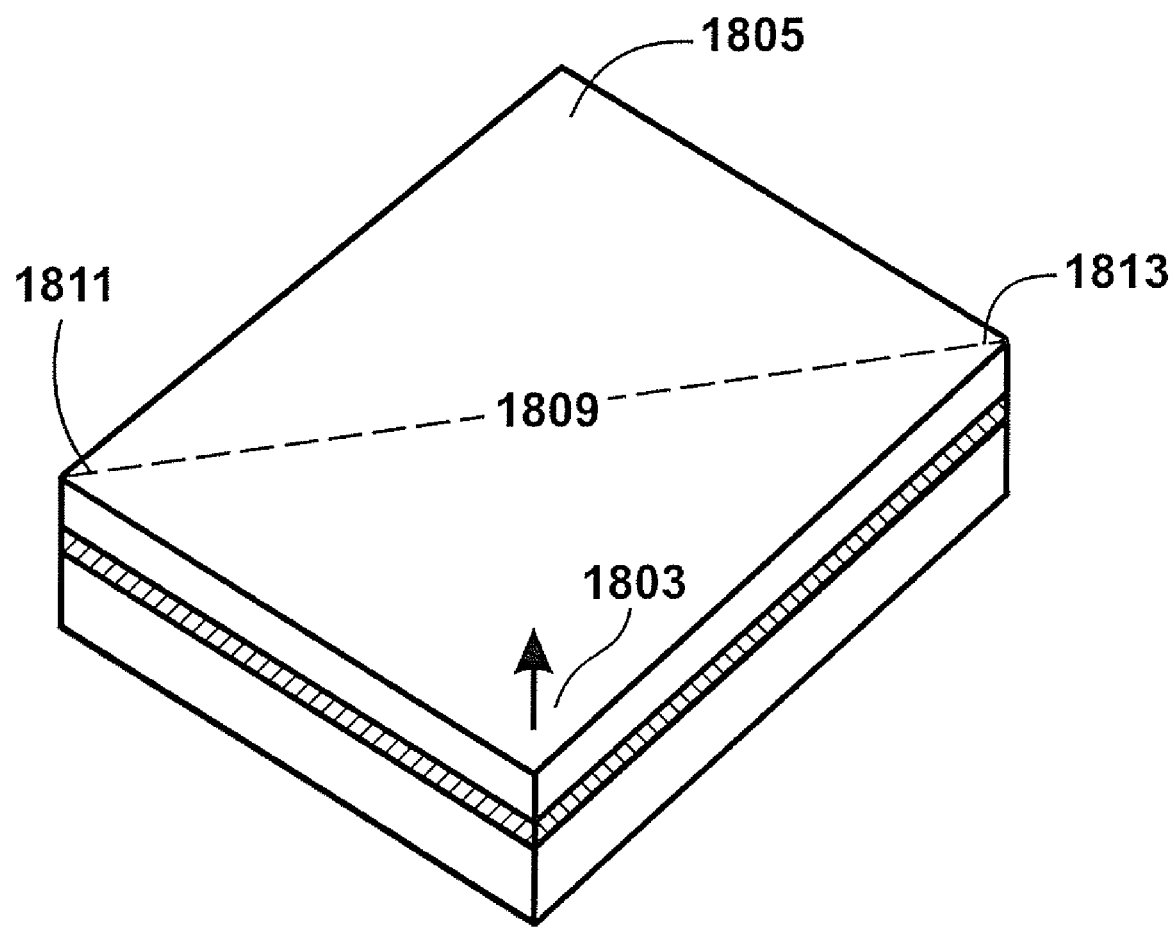

Referring now to both FIGS. 18 and 18A, the method causes a deformed shape 1801, which has a first curled edge region 1803 opposite a second curled edge region 1805 and an axis 1809 in between the first curled edge region and the second curled edge region. In a specific embodiment, the axis 1809 connects a third edge region 1811 opposite of a fourth edge region 1813. As shown in FIG. 18A is a substrate including cleave region before the cleaving process according to a specific embodiment. As shown, each of the edge regions have been identified and correspond to the simplified side view diagram of FIG. 18. Of course, there can be other variations, modifications, and alternatives.

Figure 19:
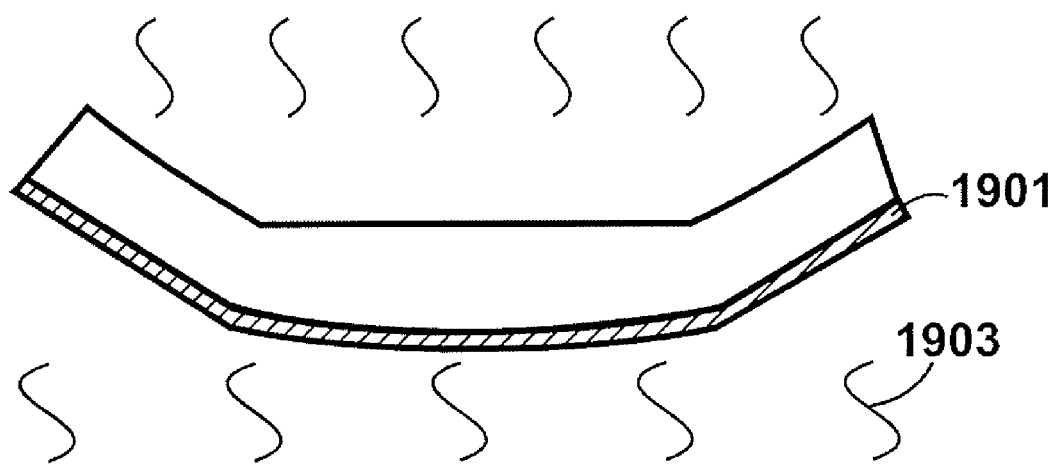
Figure 20:

Referring now to FIGS. 19 and 20, the method removes the portion 1901 of the stress region attached to the thickness of material to cause the deformed shape to be removed and yield a substantially planar shape 2001, which is generally flat or the like. In a preferred embodiment, the method includes one or more techniques 1903 to remove the portion of the stressed region that causes deformation of the thickness of material. In a specific embodiment, the removing includes etching the portion of the stressed region, which causes the thickness of material to have the deformed shape. That is, etching can be selective to remove the stressed region, which can be an implant damaged region and/or region having a higher concentration of hydrogen and/or like impurities. In a specific embodiment, etching can be wet and/or dry etching processes and the like. In a specific embodiment, the removing can also occur using thermal treatment the detached thickness of material to relax the stressed region. Alternatively, there can be a combination of etching and/or thermal treatment depending upon the embodiment. Of course, there can be other variations, modifications, and alternatives.

In a specific embodiment, the present method can perform other processes. For example, the method can place the thickness of detached material on a support member, which is later processed. Additionally or optionally, the method performs one or more processes on the semiconductor substrate before subjecting the surface region with the first plurality of high energy particles. Depending upon the embodiment, the processes can be for the formation of photovoltaic cells, integrated circuits, optical devices, any combination of these, and the like. Of course, there can be other variations, modifications, and alternatives.

In a specific embodiment, the present method uses electromagnetic radiation to perform cleaving of a cleave region to free a thickness of material. In a preferred embodiment, a laser source can be used. In a specific embodiment, the laser source provides a laser treatment of the cleave region to initiate cleaving of the cleave region. In other embodiments, the laser treatment of the cleave region does not initiate and/or cleave the cleave region but is provided merely to treat the cleave region to increase stress in the cleave region, which thereby lowers cleave temperature or dose or both. Additionally, as noted above, the laser source provides a beam that is selectively provided on a spatial region, which effectively allows the beam to pass through the spatial region and couple to the cleave region. In a specific embodiment, the top "as-cleaved" surface of may impede laser energy from efficiently coupling into the cleave region. Accordingly, the selected spatial region may be provided on a side or below or edge region, which has not been damaged or rough from cleaving. Additionally, the cleaved surface may be subjected to smoothing, annealing or treatment (e.g., deposition) to improve coupling into the cleave region. Of course, there can be other variations, modifications, and alternatives.

In other embodiments, the particles can include deuterium (e.g., $D^+$) and $H_2^+$ as implanted species. That is, such particles can be provided using a single linac process and/or configuration according to a specific embodiment. In a specific embodiment, the linac includes a beamline configuration, which allows for at least two species to be implanted. In a such embodiment, the present method uses a single linac with capability to implant both $D^+$ and $H_2^+$ (i.e., both are mass 2 nucleons). Depending upon the embodiment, there can be various benefits and/or advantages. In a preferred embodiment, the implant of two different species can be provided using one beamline. As an example, $D^+$ may be advantageous for the first implant (the getter layer formation) since $D^+$ generates about 2-3× more displacement damage in the EOR than $H^+$. The method also uses $H_2^+$ as a second implant, which would be an H-implant at twice the dose rate per unit of beam current.

In an example, the present method can include the following recipe or sequence. Of course, there can be other variations, modifications, and alternatives.

1. Strike a deuterium plasma and inject the $D^+$ into the linac apparatus for acceleration to a target energy for the getter layer formation (For example, 2 MeV would be about 50-60 um.).

2. After (1) and perhaps an interim anneal sequence to perfect the getter layer, change ECR source gas to hydrogen and strike a hydrogen plasma and inject $H_2^+$ into the linac for acceleration to a target energy to align this accumulation implant with the getter layer. A method would be to energize a linac end-section in process (2) that boosts energy appropriately. For example, the $H_2^+$ energy would have to be over 4 MeV, estimated to be closer to 4.5-5 MeV.

Of course, there can be variations, modifications, and alternatives.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. Alternatively, deuterium or other like species can also be used in combination and/or alone as an implant species. Of course there can be other variations, modifications, and alternatives. Therefore, the above description and illustrations should not be taken as limiting the scope of the present invention which is defined by the appended claims.

EXAMPLES

To prove the principles and operation of the present invention, we perform certain experiments. These experiments are merely examples, which should not unduly limit the scope of the claims herein. One of ordinary skill in the art would recognize many other variations, modifications, alternatives. Further details of these experiments can be found throughout the present specification and more particularly below.

As an example, silicon wafer samples were prepared having various orientations and impurities. In a specific embodiment, square shaped samples, which were <100> orientation and p-type doped, were prepared. In an alternative embodiment, round shaped samples, which were <111> orientation and n-type doped, were prepared. Depending upon the embodiment and experiments, we can use other variations, modifications, and alternatives. Additionally, the square and round shape lead to certain characteristics but should be used herein for labeling purposes and shall not unduly limit the scope of the claims recited below.

Such samples were cleaned using conventional SC1 and SC2 chemistries according to a specific embodiment. As an example, the wafers were subjected to a multiple implanting processes, which have been described throughout the present specification. In the round sample and square sample, implantation occurred using hydrogen particles by themselves in certain experiments and co-implantation occurred using helium and hydrogen particles in other experiments. To cleave the samples, thermal conduction/convention processes were used, which caused the thick film of material to detach as a free-standing material. Of course, there can be other variations, modifications, and alternatives.

Figure 21:
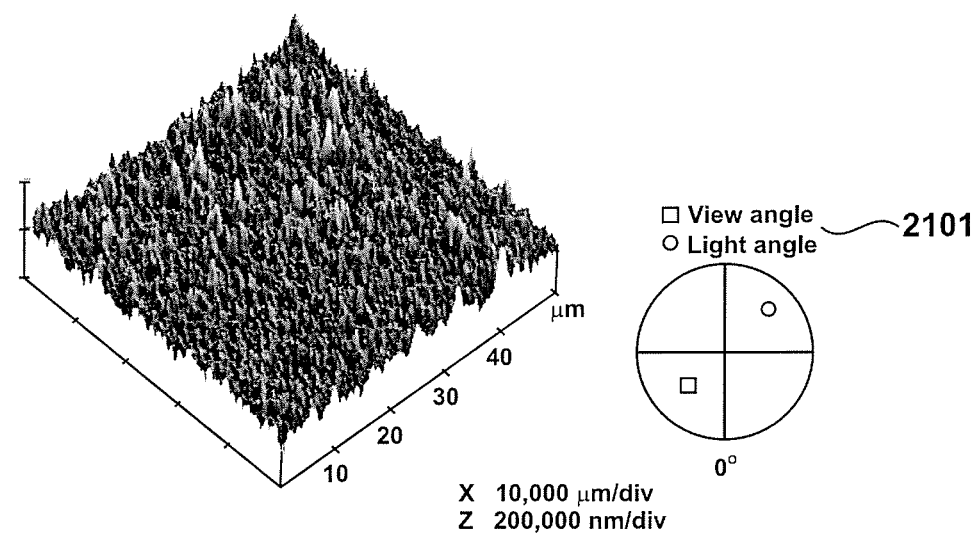
FIGS. 21-25 are simplified diagrams illustrating experimental results according to embodiments of the present invention.
Figure 21:
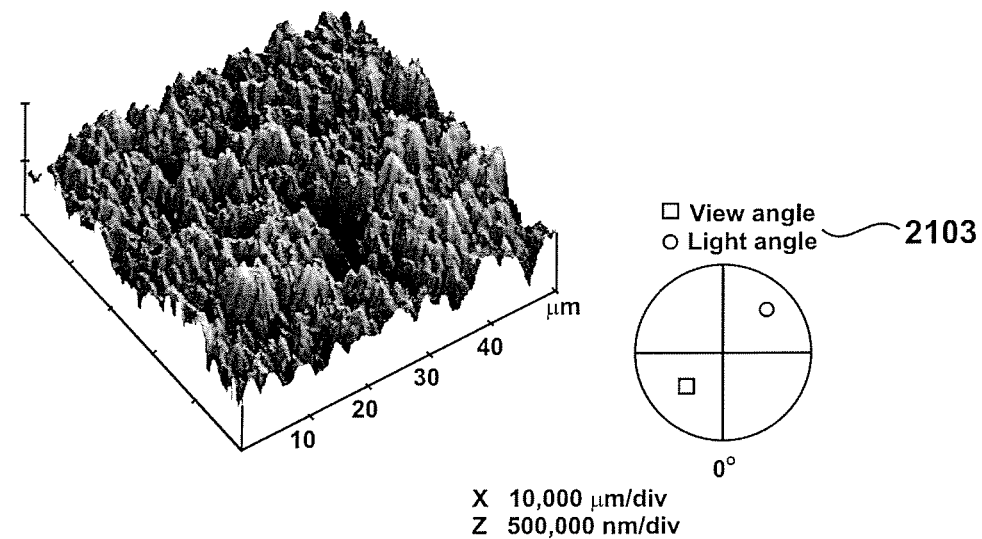
Figure 21:
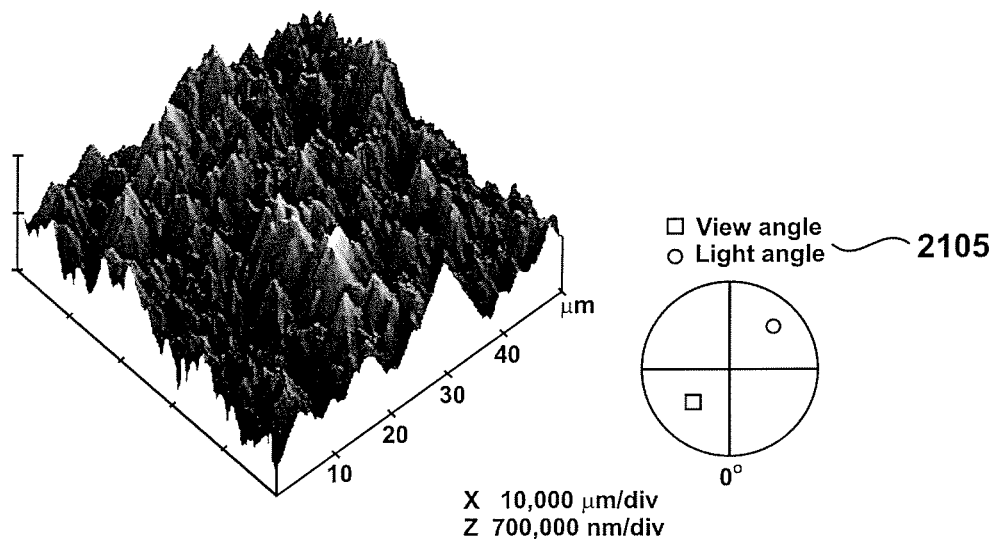

FIG. 21 illustrates AFM (i.e., atomic force microscope) images of cleave surfaces of material cleaved from a single crystal silicon substrate. As shown, image 21 was from the cleave surface of a 16 um thickness film, image 21 was from the cleave surface of a 47 um thickness film, and image 21 was from the cleave plane of a 117 um thickness film. For a thicker film, the RMS roughness is higher as shown. This is expected as forming a thicker film would require a higher energy of implant, which leads to more variation in the cleave region. Of course, there can be other variation, modification, and alternatives. Further details of these films are provided below.

Figure 22:
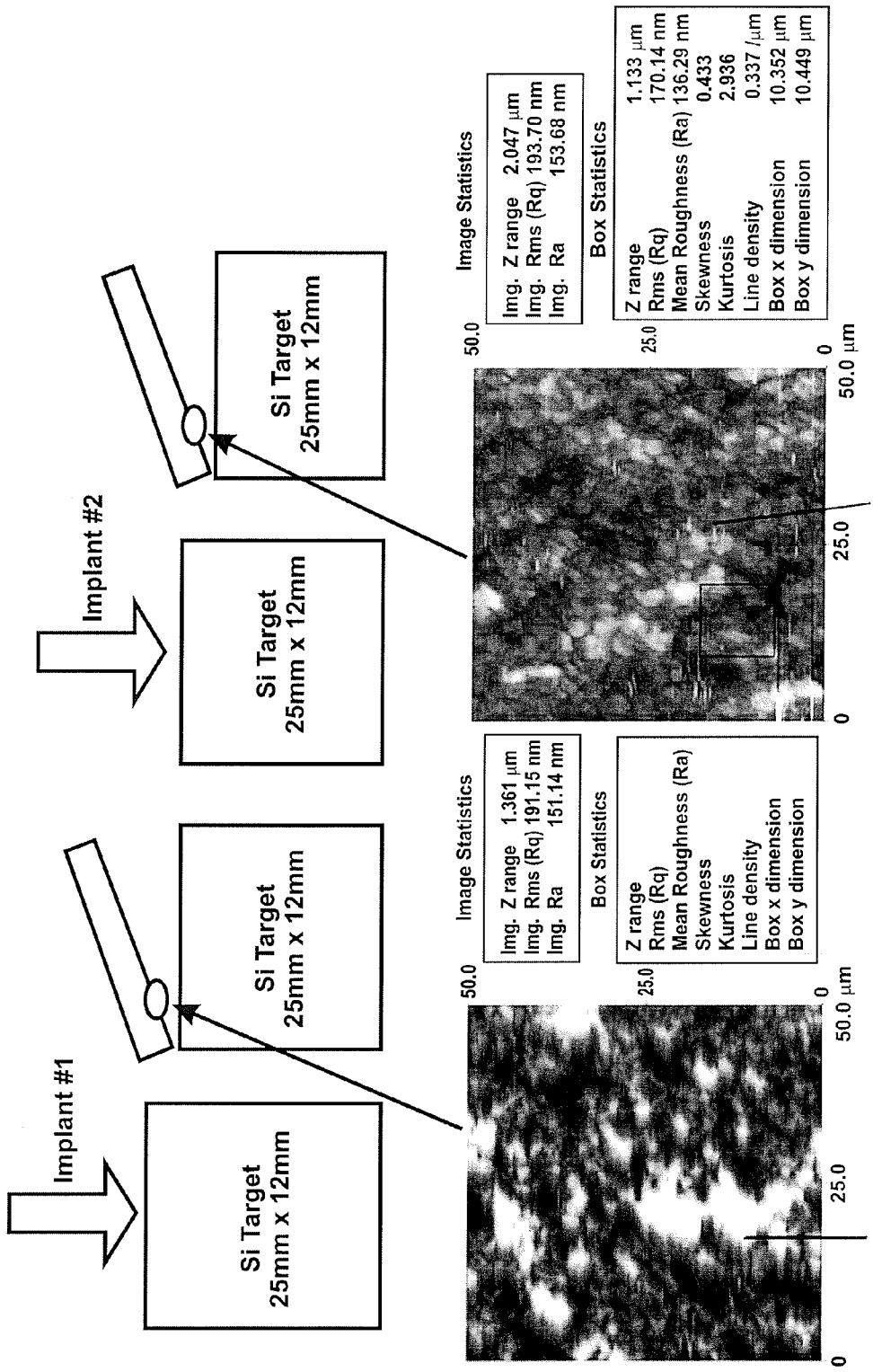

Referring to FIG. 22, surface roughness of cleave surfaces of multiple successive cleaving of single crystal silicon films are provided. As shown, surface roughness of a first silicon film 22 cleaved from a single crystal substrate, and surface roughness of a subsequent silicon film 22 cleaved from remaining substrate are provided. Each of the films has a thickness of 117 um. As illustrated, the substrate can be cleaved more than once without surface treatment between each subsequent cleaving. Depending upon the uniformity and roughness, the surface may be treated in some embodiments after multiple cleaves.

Figure 23:
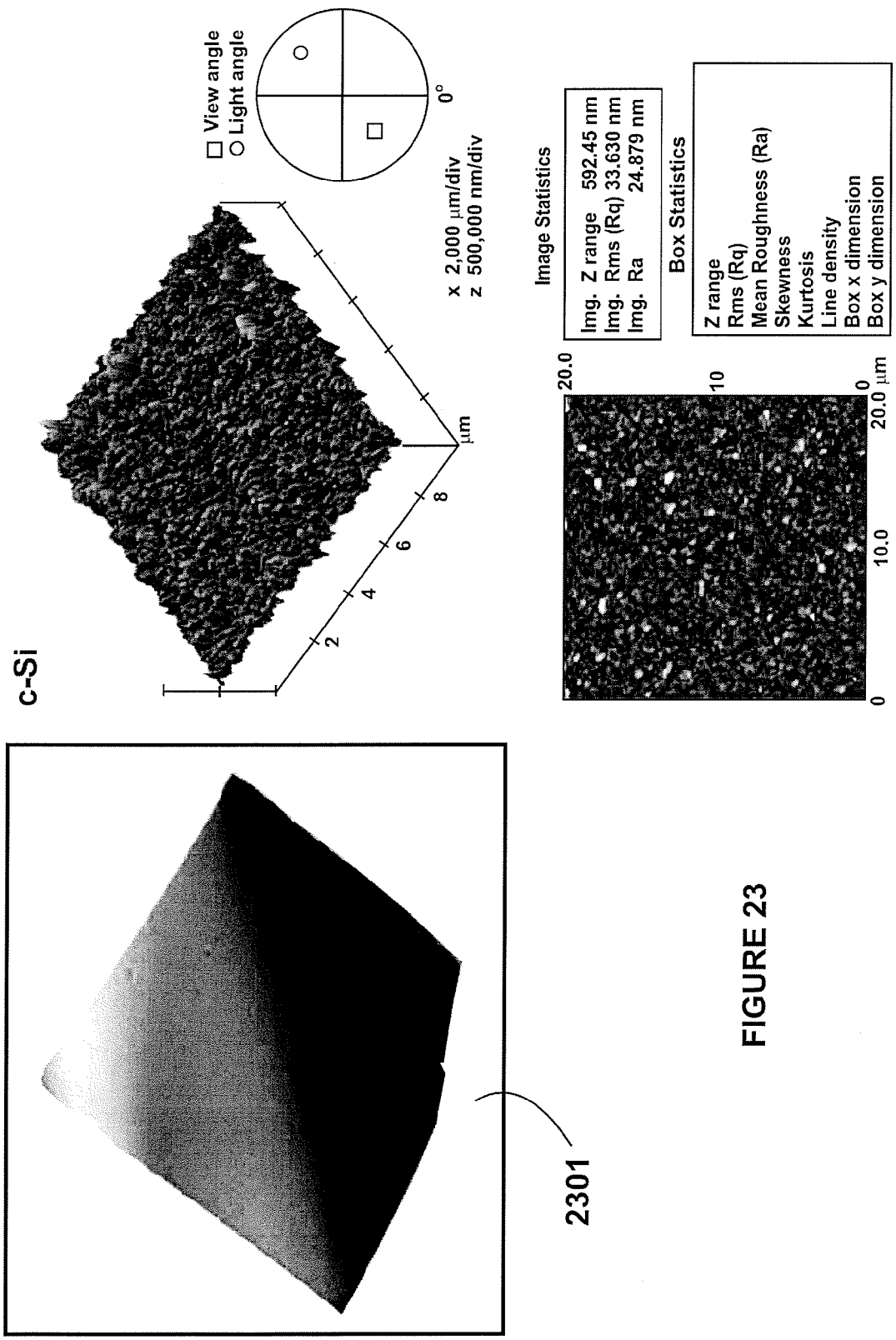
Figure 24:
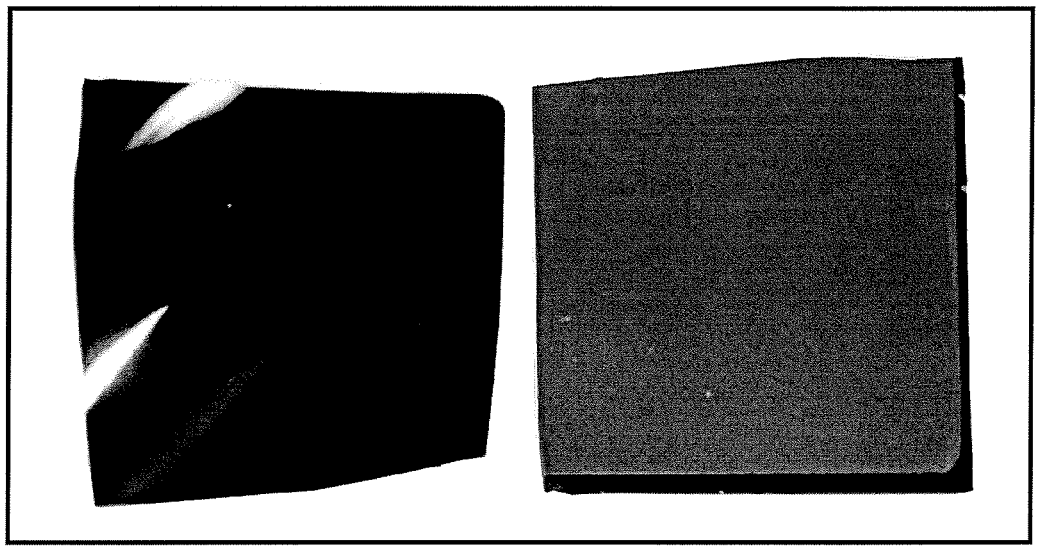
Figure 24:
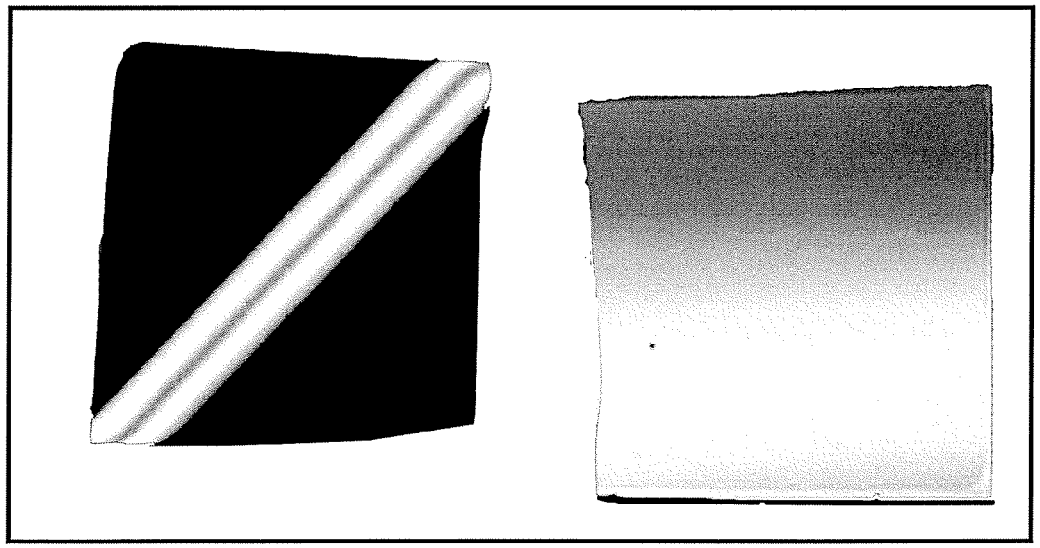

Referring to FIG. 23, a 15 um thickness of single crystal silicon film 2301 is cleaved from a single crystal silicon substrate as illustrated. The film is free standing and an AFM measurement of the cleave surface is also shown. FIG. 24 illustrates the 15 um single crystal film and the silicon substrate from which the film is cleaved. As shown, cleaving free standing films have been demonstrated. Edges of the square shaped film curve upward based upon stress subjected at the cleave region. In an example, the stress can be removed by removing the cleave region using etching and/or thermal treatments according to a specific embodiment. Of course there can be other variations, modifications, and alternatives.

Figure 25:
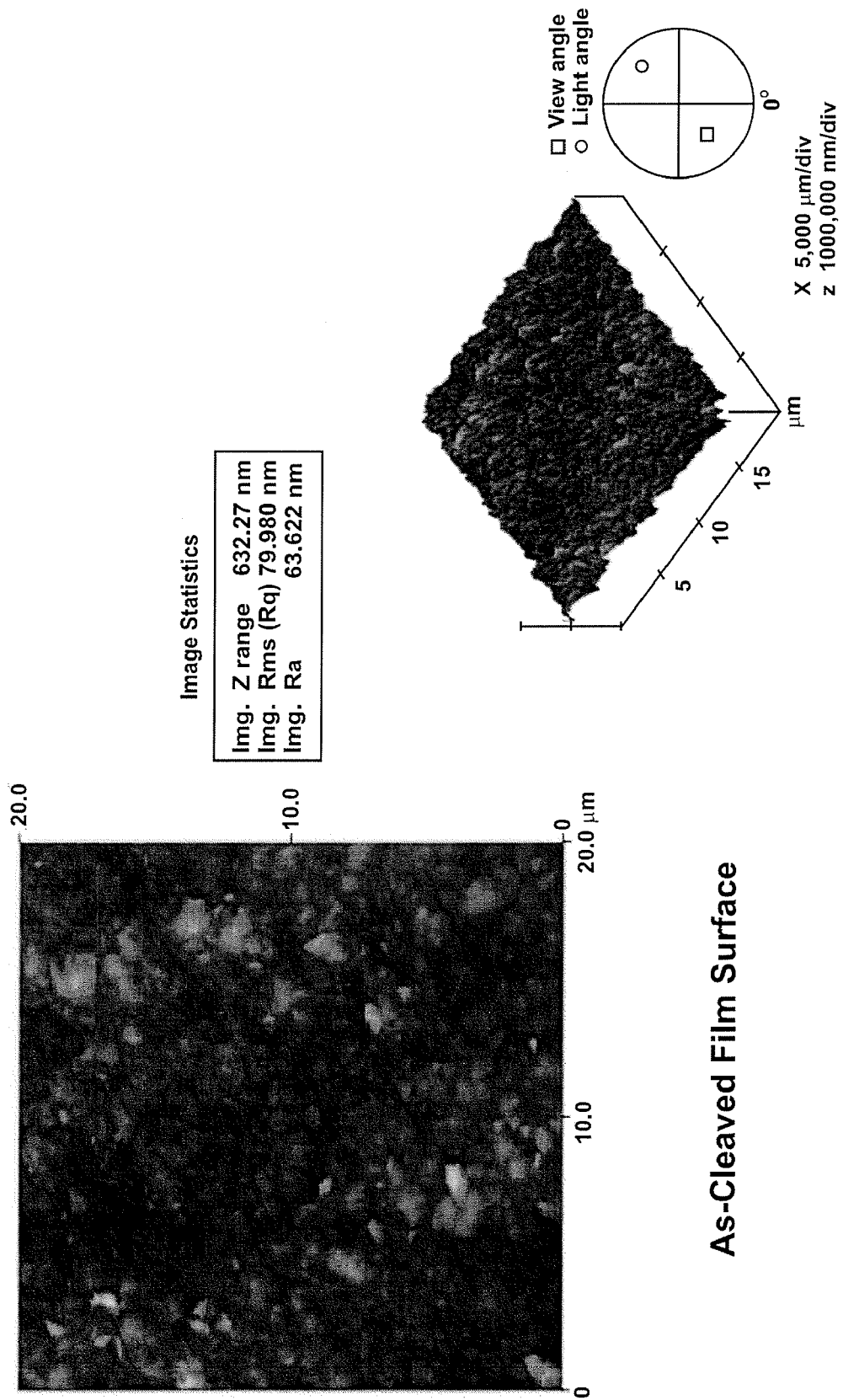

FIG. 25 illustrates experiment results of a polysilicon film cleaved from a polysilicon substrate according to an embodiment of the present invention. As shown in FIG. 25, a 20×20 um AFM image of the polysilicon substrate surface is shown. The AFM image shows image of an as cleaved polysilicon film surface. As shown, the present method demonstrated cleaving of polysilicon films in a specific embodiment. Of course there can be other variations, modifications, and alternatives.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. Alternatively, deuterium or other like species can also be used in combination and/or alone as an implant species. As noted above, almost any form of energy can be used to initiate and propagate cleaving, such as electrical, mechanical, electromagnetic radiation, gravitational, chemical, any combination of these, acoustic, microwave, and radio wave, laser sources, flood, and the like. Of course there can be other variations, modifications, and alternatives. Therefore, the above description and illustrations should not be taken as limiting the scope of the present invention which is defined by the appended claims.

What is claimed is:

1. A method for fabricating free standing thickness of materials using one or more semiconductor substrates, comprising:
   providing a semiconductor substrate having a surface region and a thickness;
   subjecting the surface region of the semiconductor substrate to a first plurality of high energy particles generated using a linear accelerator to form a region of a plurality of gettering sites within a cleave region, the cleave region being provided beneath the surface region to define a thickness of material to be detached, the semiconductor substrate being maintained at a first temperature, the first plurality of high energy particles being provided at a first implant angle;
   subjecting the semiconductor substrate to a treatment process;
   subjecting the surface region of the semiconductor substrate to a second plurality of high energy particles generated using the linear accelerator, the second plurality of high energy particles being provided to increase a stress level of the cleave region from a first stress level to a second stress level, the semiconductor substrate being maintained at a second temperature, the second plurality of particles being provided at a second implant angle different from the first implant angle; and
   freeing the thickness of detachable material using a cleaving process.

2. The method of claim 1 wherein the semiconductor substrate comprises monocrystalline silicon.

3. The method of claim 1 wherein the semiconductor substrate comprises polysilicon silicon.

4. The method of claim 1 wherein the first high energy particles comprise hydrogen species.

5. The method of claim 4 wherein the hydrogen species are provided at a dose of $2 \times 10^{16}$ per cm$^2$ and less.

6. The method of claim 4 wherein the hydrogen species are provided at a dose of $5 \times 10^{15}$ per cm$^2$ and less.

7. The method of claim 1 wherein the first high energy particles comprise helium species.

8. The method of claim 1 wherein the semiconductor substrate is provided on a tray device.

9. The method of claim 8 wherein the tray device provides for the first implant angle and the second implant.

10. The method of claim 1 wherein the first implant angle is about zero to about 30 degrees.

11. The method of claim 1 wherein the first implant angle is about zero to about 25 degree.

12. The method of claim 1 wherein the second high energy particles comprises hydrogen species.

13. The method of claim 12 wherein the hydrogen species comprise a dose of $5 \times 10^{16}$ per cm$^2$ and less.

14. The method of claim 12 wherein the hydrogen species comprise a dose $5 \times 10^{15}$ per cm$^2$ and less.

15. The method of claim 1 wherein the second high energy particles comprises helium species or a combination of helium species and hydrogen species originated in a remote plasma system.

16. The method of claim 1 wherein the second implant angle is about zero to about 15 degree.

17. The method of claim 1 wherein the second implant angle is about zero to about seven degree.

18. The method of claim 1 wherein the linear accelerator comprises a radio frequency quadrupole (RFQ).

19. The method of claim 1 wherein the linear accelerator comprises a drift tube linear accelerator (DTL).

20. The method of claim 1 wherein the linear accelerator comprises a RF-Focused Interdigitated linear accelerator (RFI).

21. The method of claim 1 wherein the first plurality of high energy particles are provided in an energy ranging from 1 MeV to 5 MeV.

22. The method of claim 1 wherein the gettering sites comprise a microscopic defect region within a vicinity of the cleave region.

23. The method of claim 1 wherein the microscopic defect region comprises a plurality of voids provided between certain crystal planes of the semiconductor substrate.

24. The method of claim 1 wherein the treatment process is a thermal process provided at a temperature of 400 Degree Celsius or higher to render the microscopic defect region to be close to the cleave region and stabilize the microscopic defect region.

25. The method of claim 1 wherein the first temperature ranges from about −100 Degree Celsius to about 250 Degree Celsius.

26. The method of claim 1 wherein the first temperature is less than about 250 Degree Celsius.

27. The method of claim 1 wherein the second temperature is greater than about 250 Degree Celsius and no greater than 550 Degrees Celsius.

28. The method of claim 1 wherein the thickness of detachable material has a thickness greater than about 50 um.

29. The method of claim 1 wherein the thickness of detachable material has a thickness greater than about 80 um.

30. The method of claim 1 wherein the thickness of detachable material has a thickness greater than about 100 um.

31. The method of claim 1 wherein the cleaving process is a controlled cleaving process.

32. The method of claim 1 wherein the cleaving process is a thermal process.

33. The method of claim 1 wherein the second temperature ranges from about 20 Degree Celsius to about 450 Degree Celsius.

34. The method of claim 1 wherein the first plurality of high energy particles and the second plurality of high energy particles are provided in an expanded beam from the linear accelerator.

35. The method of claim 34 wherein the expanded beam has a dimension of about 500 mm in diameter on the surface region of the semiconductor substrate.

36. The method of claim 1 wherein the linear accelerator comprises a DC accelerator.

37. A method for fabricating free standing thickness of materials using one or more semiconductor substrates, comprising:
   providing a semiconductor substrate having a surface region and a thickness;
   subjecting the surface region of the semiconductor substrate to a first plurality of high energy particles generated using a linear accelerator to form a patterned region of a plurality of gettering sites within a cleave region, the cleave region being provided beneath the surface region to define a thickness of material to be detached, the semiconductor substrate being maintained at a first temperature, the first plurality of high energy particles being provided at a first implant angle, the patterned region being provided to cause initiation of a cleaving action;

subjecting the semiconductor substrate to a treatment process;
subjecting the surface region of the semiconductor substrate to a second plurality of high energy particles, the second plurality of high energy particles being provided to increase a stress level of the cleave region from a first stress level to a second stress level, the semiconductor substrate being maintained at a second temperature, the second plurality of particles being provided at a second implant angle different from the first implant angle;
initiating the cleaving action at a selected region of the patterned region to detach a portion of the thickness of detachable material using a cleaving process; and
freeing the thickness of detachable material using a cleaving process.

38. The method of claim 37 wherein the patterned region is provided in a peripheral region of the semiconductor substrate.

39. The method of claim 37 wherein the patterned region is provided in a z-direction from the surface region to the gettering sites.

40. The method of claim 37 wherein the patterned region is provided within the gettering sites.

41. A method for fabricating free standing thickness of materials using one or more semiconductor substrates, comprising:

providing a semiconductor substrate having a surface region and a thickness;
subjecting the surface region of the semiconductor substrate to a first plurality of high energy particles comprising D+ species generated using a linear accelerator and provided at a first implant angle to form a plurality of gettering sites within a cleave region, the cleave region being provided beneath the surface region to define a thickness of material to be detached;
subjecting the semiconductor substrate to a treatment process;
subjecting the surface region of the semiconductor substrate to a second plurality of high energy particles comprising H2+ species using the linear accelerator, the second plurality of high energy particles being provided at a second implant angle different from the first implant angle to increase a stress level of the cleave region from a first stress level to a second stress level;
initiating the cleaving action at a selected region of the cleave region to detach a portion of the thickness of detachable material using a cleaving process; and
freeing the thickness of detachable material.

* * * * *